US012573998B2

(12) United States Patent
Roh

(10) Patent No.: US 12,573,998 B2
(45) Date of Patent: Mar. 10, 2026

(54) MATCHING CIRCUIT OF NEAR FIELD COMMUNICATION (NFC) DEVICE, RESONANCE CIRCUIT OF NFC DEVICE AND NFC DEVICE

(71) Applicant: Samsung Electronics Co., Ltd., Suwon-si (KR)

(72) Inventor: Hyounghwan Roh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 331 days.

(21) Appl. No.: 18/321,270

(22) Filed: May 22, 2023

(65) Prior Publication Data

US 2024/0171147 A1      May 23, 2024

(30) Foreign Application Priority Data

Nov. 17, 2022     (KR) ......................... 10-2022-0154305

(51) Int. Cl.
*H03H 7/38*          (2006.01)
*H03H 7/24*          (2006.01)
*H04B 5/24*          (2024.01)

(52) U.S. Cl.
CPC ................. *H03H 7/38* (2013.01); *H03H 7/24* (2013.01); *H04B 5/24* (2024.01)

(58) Field of Classification Search
CPC .......... H04B 5/00–70; H03H 7/38–40; G06K 19/00–18
See application file for complete search history.

(56) References Cited

U.S. PATENT DOCUMENTS

| | | | |
|---|---|---|---|
| 7,761,065 B2 | 7/2010 | Drogi et al. | |
| 8,559,890 B2 | 10/2013 | Merlin | |
| 8,934,837 B2 | 1/2015 | Zhu et al. | |
| 9,019,167 B2 | 4/2015 | Merlin | |
| 9,026,050 B2 * | 5/2015 | Ikeda ....................... | H04B 5/77 |
| | | | 455/193.1 |
| 9,130,543 B2 | 9/2015 | McKinzie | |
| 9,136,915 B2 * | 9/2015 | Yoon ........................ | H04B 5/77 |

(Continued)

FOREIGN PATENT DOCUMENTS

| | | | | |
|---|---|---|---|---|
| CA | 2626826 A1 * | 9/2008 | ......... | G06K 19/0723 |
| CN | 109327245 A * | 2/2019 | ......... | G06K 7/10297 |
| KR | 20070023567 A * | 2/2004 | ......... | G06K 19/0723 |

OTHER PUBLICATIONS

Extended European Search Report, dated Mar. 27, 2024, issued in European Patent Application No. 23182198.4.

*Primary Examiner* — Gennadiy Tsvey
(74) *Attorney, Agent, or Firm* — Harness, Dickey & Pierce, P.L.C.

(57)          ABSTRACT

A matching circuit of a near field communication (NFC) device, the matching circuit being coupled between an antenna and an NFC chip, and the matching circuit including first passive elements coupled in series between a first terminal of the antenna and a first transmission terminal of the NFC chip, the antenna configured to respond to an electromagnetic wave, a second passive element directly coupled to a second terminal of the antenna and a second transmission terminal of the NFC chip, the first passive elements and the second passive element being asymmetric with respect to each other, and third passive elements coupled to at least the first terminal and the second transmission terminal.

20 Claims, 24 Drawing Sheets

50a

150a

(56)     References Cited

U.S. PATENT DOCUMENTS

|  |  |  |  |  |
|---|---|---|---|---|
| 9,893,751 | B2 * | 2/2018 | Bando | H04B 1/0458 |
| 10,361,474 | B2 | 7/2019 | Ding et al. | |
| 10,511,347 | B2 * | 12/2019 | Hueber | G06K 7/10297 |
| 10,516,445 | B2 | 12/2019 | Hueber et al. | |
| 2007/0045418 | A1 * | 3/2007 | Charrat | G06K 19/0723 |
| | | | | 235/451 |
| 2007/0296593 | A1 * | 12/2007 | Hall | G08B 13/2477 |
| | | | | 343/745 |
| 2009/0224893 | A1 * | 9/2009 | Kondo | G06K 7/10336 |
| | | | | 340/10.51 |
| 2009/0247079 | A1 * | 10/2009 | Charles | G06K 19/0723 |
| | | | | 455/41.1 |
| 2010/0321128 | A1 * | 12/2010 | Merlin | G06K 7/10316 |
| | | | | 333/112 |
| 2012/0064826 | A1 * | 3/2012 | Darwhekar | H04B 5/48 |
| | | | | 455/41.1 |
| 2014/0154980 | A1 * | 6/2014 | Jang | H04B 5/70 |
| | | | | 455/41.1 |
| 2015/0079903 | A1 * | 3/2015 | Song | H04W 52/0245 |
| | | | | 455/41.1 |
| 2015/0365139 | A1 * | 12/2015 | Moon | H04B 5/24 |
| | | | | 455/41.1 |
| 2016/0134333 | A1 * | 5/2016 | Cho | H03D 1/10 |
| | | | | 455/41.1 |
| 2016/0134730 | A1 * | 5/2016 | Lee | H04M 1/7246 |
| | | | | 455/552.1 |
| 2016/0142866 | A1 * | 5/2016 | Jang | H02J 50/12 |
| | | | | 455/41.1 |
| 2016/0241306 | A1 * | 8/2016 | Moon | H01Q 7/00 |
| 2016/0359527 | A1 * | 12/2016 | Jang | H04B 5/77 |
| 2016/0365635 | A1 * | 12/2016 | Jang | H04B 5/26 |
| 2016/0380337 | A1 * | 12/2016 | Lee | H01Q 21/28 |
| | | | | 343/702 |
| 2017/0019152 | A1 * | 1/2017 | Kim | H04B 1/16 |
| 2017/0077996 | A1 * | 3/2017 | Kim | H04B 5/48 |
| 2017/0126267 | A1 * | 5/2017 | Park | H04B 1/3888 |
| 2017/0126279 | A1 * | 5/2017 | Jung | G06F 1/04 |
| 2017/0357961 | A1 * | 12/2017 | Bidari | H04B 5/26 |
| 2019/0067818 | A1 * | 2/2019 | Cordier | H01Q 7/005 |
| 2019/0190567 | A1 * | 6/2019 | Moon | H04B 5/79 |
| 2020/0169300 | A1 * | 5/2020 | Moon | H03L 7/0814 |
| 2020/0186199 | A1 * | 6/2020 | Ding | H04B 5/24 |
| 2020/0242309 | A1 * | 7/2020 | Poetscher | H04W 4/80 |
| 2022/0376734 | A1 * | 11/2022 | Kang | H02J 50/12 |

* cited by examiner

<u>5</u>

50a

150a

100a

50ab

50b

50ba

50c

50d

50e

MATCHING CIRCUIT OF NEAR FIELD COMMUNICATION (NFC) DEVICE, RESONANCE CIRCUIT OF NFC DEVICE AND NFC DEVICE

CROSS-REFERENCE TO RELATED APPLICATION

This application claims priority under 35 USC § 119 to Korean Patent Application No. 10-2022-0154305, filed on Nov. 17, 2022, in the Korean Intellectual Property Office (KIPO), the disclosure of which is hereby incorporated by reference herein in its entirety.

BACKGROUND

1. Technical Field

Example embodiments described herein relate to near field communication (NFC). In particular, example embodiments relate to a matching circuit of NFC device, a resonance circuit of NFC device and an NFC device.

2. Description of the Related Art

NFC technology is a type of wireless communication technology. Recent developments in NFC technology have resulted in NFC devices being used extensively in mobile devices.

When NFC devices operate in a card mode, NFC devices may perform payment and when NFC devices operate in a reader mode, NFC devices may perform identification and security clearance.

SUMMARY

Example embodiments provide for enhanced performance of NFC devices in the reader mode by increasing an output power of the NFC devices in the reader mode. Example embodiments may provide a matching circuit of NFC device, capable of increasing power of transmission signal in a reader mode.

Example embodiments may provide a resonance circuit of NFC device, capable of increasing power of transmission signal in a reader mode.

Example embodiments may provide an NFC device capable of increasing power of transmission signal in a reader mode.

According to example embodiments, a matching circuit of an NFC device, the matching circuit being coupled between an antenna and an NFC chip, and the matching circuit including first passive elements coupled in series between a first terminal of the antenna and a first transmission terminal of the NFC chip, the antenna configured to respond to an electromagnetic wave, a second passive element directly coupled to a second terminal of the antenna and a second transmission terminal of the NFC chip, the first passive elements and the second passive element being asymmetric with respect to each other, and third passive elements coupled to at least the first terminal and the second transmission terminal.

According to example embodiments, a resonance circuit of an NFC device including an antenna configured to respond to an electromagnetic wave, and a matching circuit coupled between the antenna and an NFC chip, the matching circuit configured to perform an impedance matching and adjust a resonance frequency, and the matching circuit including first passive elements connected in series between a first terminal of the antenna and a first transmission terminal of the NFC chip, a second passive element directly coupled to a second terminal of the antenna and a second transmission terminal of the NFC chip, the first passive elements and the second passive element being asymmetric with respect to each other, and third passive elements coupled to at least the first terminal and the second transmission terminal.

According to example embodiments, an NFC device including an antenna, a matching circuit, coupled between first and second terminals of the antenna, the matching circuit being configured to generate a field voltage in response to an electromagnetic field induced in the antenna, and an NFC chip configured to detect an NFC card or an NFC reader based on a magnitude of the field voltage, operate in a reader mode in response to detecting the NFC card, and operate in a card mode in response to detecting the NFC reader, the matching circuit including first passive elements connected in series between a first terminal of the antenna and a first transmission terminal of the NFC chip, the first passive elements including a first capacitor coupled between the first terminal and a first node, and an inductor coupled between the first node and the first transmission terminal, a second passive element directly coupled to a second terminal of the antenna and a second transmission terminal of the NFC chip, the second passive element including a second capacitor directly coupled between the second terminal and the second transmission terminal, and third passive elements coupled to at least the first terminal and the second transmission terminal.

According to example embodiments, a resonance circuit of an NFC device including an antenna configured to respond to an electromagnetic wave, a matching circuit coupled between the antenna and an NFC chip, the matching circuit being configured to perform an impedance matching and adjust a resonance frequency, and the matching circuit including a first capacitor and a first inductor coupled in series between a first terminal of the antenna and a first transmission terminal of the NFC chip, a second capacitor and a second inductor coupled in series between a second terminal of the antenna and a second transmission terminal of the NFC chip, a third capacitor coupled between the first terminal and a ground voltage, a fourth capacitor coupled between the second terminal and the ground voltage, a fifth capacitor coupled between the ground voltage and a first node, the first capacitor and the first inductor being coupled to the first node, and a sixth capacitor coupled between the ground voltage and a second node, the second capacitor and the second inductor being coupled to the second node, and an attenuation circuit coupled to the first terminal, the second terminal, a first reception terminal of the NFC chip and a second reception terminal of the NFC chip, the attenuation circuit being configured to attenuate a signal induced in the antenna in response to the electromagnetic wave, and the attenuation circuit includes a first attenuation capacitor directly coupled between the first terminal and the first reception terminal, and a second attenuation capacitor directly coupled between the second terminal and the second reception terminal.

Accordingly, the matching circuit of the NFC device includes first passive elements coupled in series between a first terminal of an antenna and a first transmission terminal of an NFC chip, and a second passive element directly coupled between a second terminal of the antenna and a second transmission terminal of the NFC chip and the second passive element includes a capacitor instead of an inductor. Accordingly, power of transmission signals may be increased, which are provided to the first and second transmission terminals when a signal transmission operation is performed in a reader mode of the NFC device.

BRIEF DESCRIPTION OF THE DRAWINGS

Example embodiments of the present disclosure will be described below in more detail with reference to the accompanying drawings.

DETAILED DESCRIPTION

Figure 1:
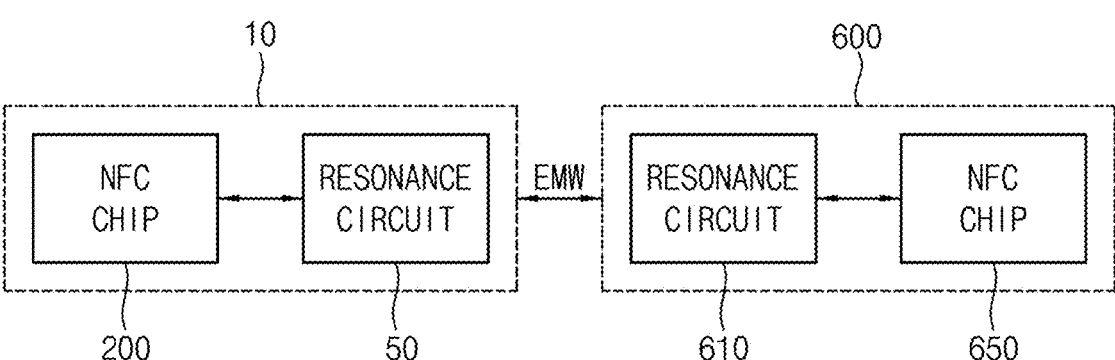
FIG. 1 is a block diagram illustrating a near field communication (NFC) system according to example embodiments.

Example embodiments will be described more fully hereinafter with reference to the accompanying drawings, in which example embodiments are shown. In the drawings, like numerals refer to like elements throughout. The repeated descriptions may be omitted.

FIG. 1 is a block diagram illustrating a near field communication (NFC) system according to example embodiments.

In an NFC system 5 of FIG. 1, NFC devices 10 and 600 communicate with each other based on an NFC scheme. In a card mode, in which the NFC device 10 operates as a card, the NFC device 10 may transceive data with an NFC device 600 (or NFC reader) based on an electromagnetic wave EMW provided from an NFC reader (e.g., the NFC device 600). In a reader mode, in which the NFC device 10 operates as a reader, the NFC device 10 may transceive data with the NFC device 600 based on an EMW provided from the NFC device 10.

Referring to FIG. 1, the NFC system 5 may include the NFC devices 10 and 600. The NFC device 10 may include a resonance circuit 50 and an NFC chip 200. The NFC device 600 may include a resonance circuit 610 and an NFC chip 650.

During reception operation, the resonance circuit 50 may receive an input data from the NFC device 600 based on the electromagnetic wave EMW and the NFC chip 200 may receive the input data from the resonance circuit 50. During transmission operation, the NFC chip 200 may provide an output message to the resonance circuit 50 and the resonance circuit 50 may transmit the output message to the NFC device 600 through the electromagnetic wave EMW.

In the card mode, the resonance circuit 50 may provide a signal, which is induced in response to the electromagnetic wave EMW received from the NFC device 600, to the NFC chip 200 and the NFC chip 200 may perform the signal reception operation by generating the input data by demodulating the signal. In the card mode for a signal transmission operation, the NFC chip 200 may provide a modulation signal, which is generated by modulating the output data, to the resonance circuit 50 and the resonance circuit 50 may perform the signal transmission operation by reflecting the electromagnetic wave EMW received from the NFC device 600 based on the modulation signal.

In the reader mode, the NFC chip 200 may provide a transmission signal as part of a signal transmission operation, which is obtained by synthesizing the modulation signal generated by modulating the output message with a carrier signal, to the resonance circuit 50 and the resonance circuit 50 may provide the transmit signal in the form of the electromagnetic wave EMW to the NFC device 600 to perform the signal transmission operation. In the reader mode, the NFC chip 200 may provide a signal as part of a signal receive operation, which is induced in response to the EMW reflected from the NFC device 600, and the NFC chip 200 may generate the input data by demodulating the signal to perform the signal reception operation.

NFC is a contactless short-range wireless communication standard between electronic devices within a short distance of 10 cm with low power consumption by using a frequency of 13.56 MHz. A data transfer rate of an NFC system is 424 Kbps, and an NFC system has excellent security due to high proximity and encryption technology. NFC forgoes a complicated pairing process for recognition of devices but allows devices to recognize one another within ⅒ second or less. In particular, NFC is a smart card type contactless wireless communication technology where radio frequency identification (RFID) technology is utilized. In addition, NFC builds upon RFID technology by allowing two-way communication, as compared to smart cards, which has only one-way communication, and has a relatively large memory storage space and offers more variety of services.

In detail, NFC is a wireless communication method in which data is directly exchanged between terminals, for example, between the NFC device 10 and the NFC device 600, without using a communication network, and is a type of RFID method. A wireless communication method using RFID may be classified according to frequencies used. For example, RFID at 13.56 MHz is mainly used for smart cards, such as transit cards or entrance cards, and RFID at 900 MHz is used mainly for logistics.

NFC corresponds to RFID which, like smartcards, uses a frequency of 13.56 MHz. However, unlike smartcards, which allow only one-way communication, NFC allows two-way communication.

Figure 2:
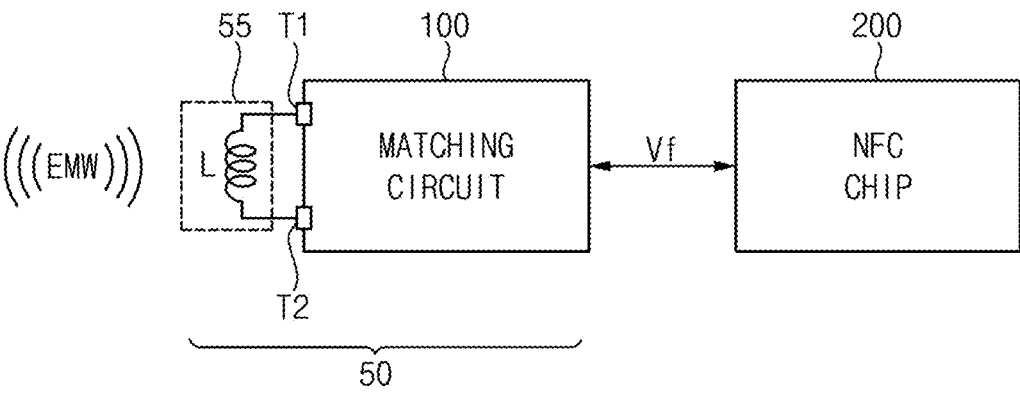
FIG. 2 is a block diagram illustrating an example of the NFC device in the NFC system of FIG. 1 according to example embodiments.

FIG. 2 is a block diagram illustrating an example of the NFC device in the NFC system of FIG. 1 according to example embodiments.

Referring to FIG. 2, the NFC device 10 may include a resonance circuit 50 and the NFC chip 200. The resonance circuit 50 may include an antenna 55 and a matching circuit 100.

The matching circuit 100 may be connected to first and second terminals T1 and T2 of the antenna 55 which responds to the electromagnetic wave EMW and may generate a corresponding field voltage Vf used by the NFC chip 200.

The NFC chip 200 may detect whether an NFC card or an NFC reader exists around the NFC chip 200 based on a magnitude of the field voltage Vf. When the NFC chip 200 detects an NFC card, the NFC chip 200 may set a resonance frequency of the matching circuit 100 as a first frequency (e.g., a first optimal frequency) based on Vf and may operate in the reader mode. When an NFC reader is detected, the NFC chip 200 may set the resonance frequency of the matching circuit 100 as a second frequency (e.g., a second optimal frequency) based on at least one of the inner currents generated in response to the magnitude of the field voltage Vf and the electromagnetic wave EMW, and may operate in the card mode.

Figure 3:
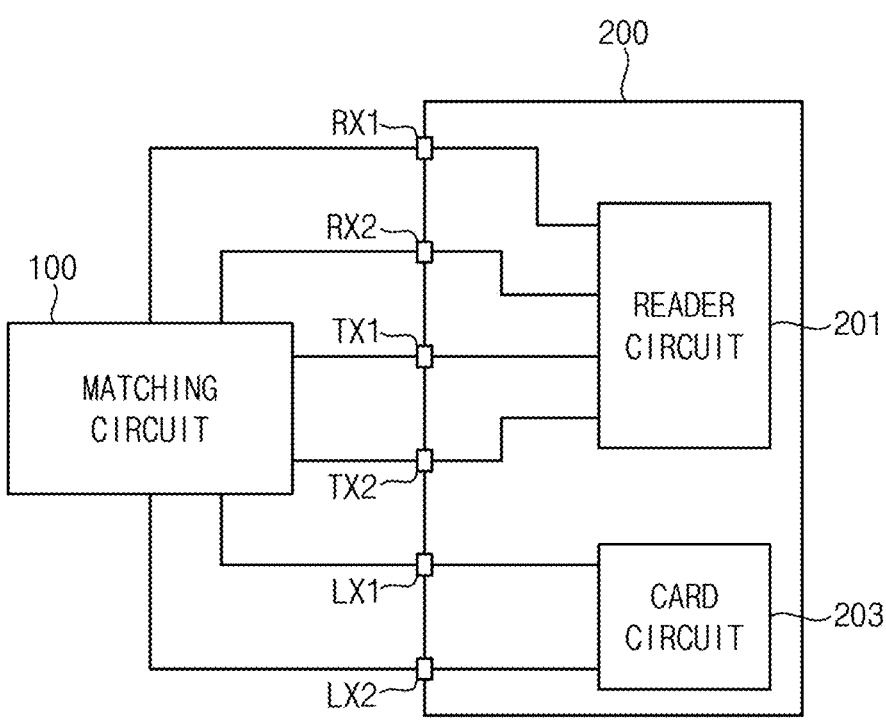
FIG. 3 illustrates a connection relationship between the matching circuit and the NFC chip in the NFC device of FIG. 2.

FIG. 3 illustrates a connection relationship between the matching circuit and the NFC chip in the NFC device of FIG. 2.

Referring to FIG. 3, the NFC chip 200 may include a reader circuit 201 and/or a card circuit 203. The matching circuit 100 may be connected to the reader circuit 201 of the NFC chip 200 through a first reception terminal RX1, a second reception terminal RX2, a first transmission terminal TX1 and a second transmission terminal TX2. The matching circuit 100 may be further connected to the card circuit 203 of the NFC chip 200 through a first power terminal LX1 and a second power terminal LX2.

Figure 4A:
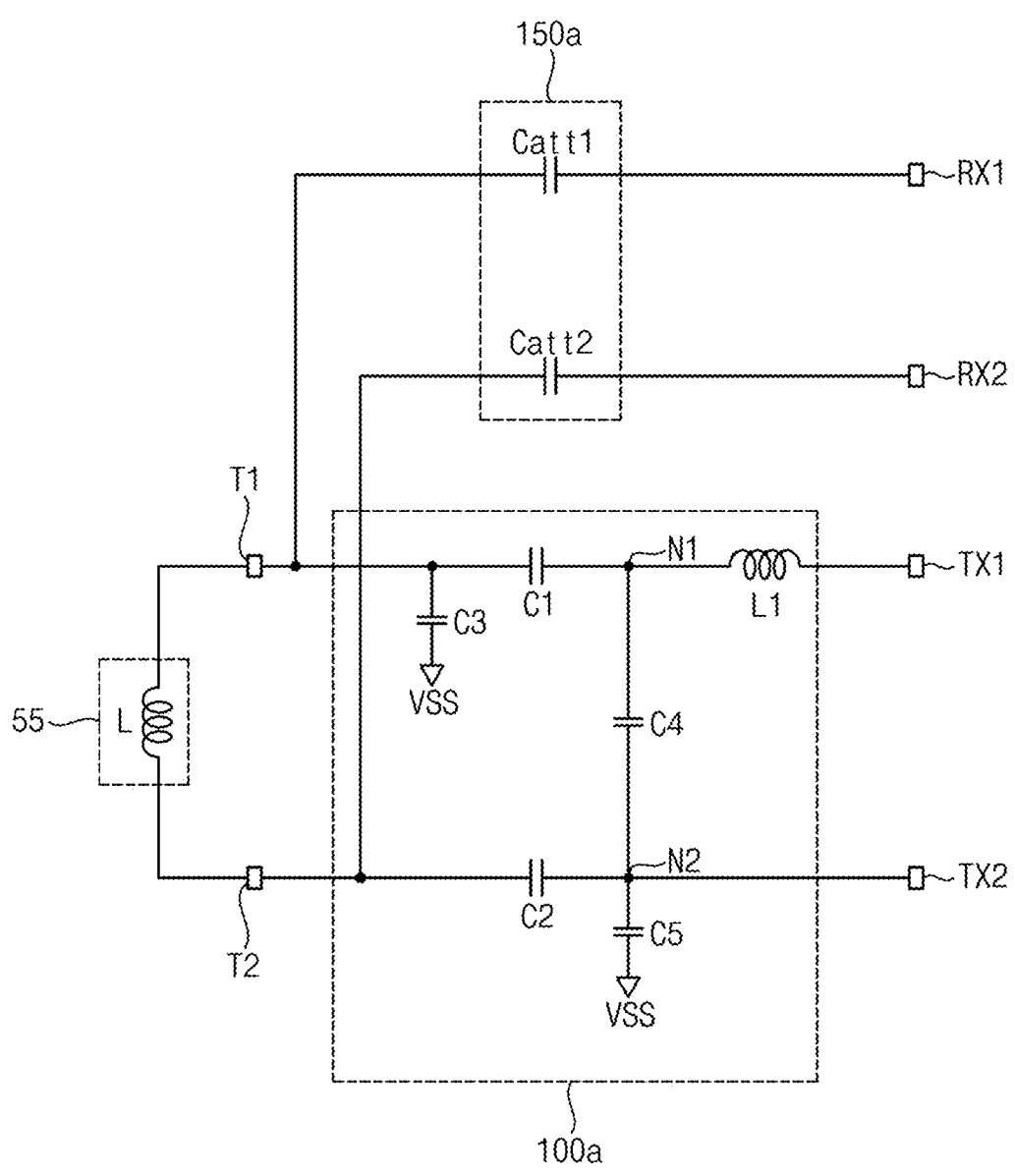
FIG. 4A is a circuit diagram illustrating an example of the resonance circuit in FIG. 2 according to example embodiments.

FIG. 4A is a circuit diagram illustrating an example of the resonance circuit in FIG. 2 according to example embodiments.

Referring to FIG. 4A, a resonance circuit 50a may include an antenna 55 and a matching circuit 100a. The resonance circuit 50a may further include an attenuation circuit 150a.

The matching circuit 100a may include first passive elements coupled in series between a first terminal T1 of the antenna 55 and the first transmission terminal TX1, a second passive element directly coupled to a second terminal T2 of the antenna 55 and the second transmission terminal TX2, and third passive elements coupled to the first terminal T1 and the second transmission terminal TX2.

The first passive elements may include a first capacitor C1 and a first inductor L1 coupled in series between the first terminal T1 and the first transmission terminal TX1. The first capacitor C1 and the first inductor L1 may be coupled to each other at a first node N1. The second passive element may include a second capacitor C2 directly coupled between the second terminal T2 and the second transmission terminal TX2. Therefore, the first passive elements and the second passive element may be asymmetric with respect to each other.

In example embodiments, the third passive elements may include a third capacitor C3, a fourth capacitor C4 and a fifth capacitor C5. The third capacitor C3 may be coupled between the first terminal T1 and a ground voltage VSS. The fourth capacitor C4 may be coupled between the first node N1 and a second node N2 to which the second capacitor C2 and the second transmission terminal TX2 are coupled. The fifth capacitor C5 may be coupled between the second node N2 and the ground voltage VSS.

The third capacitor C3 is asymmetric with the fourth capacitor C4 and the fifth capacitor C5 with respect to the first capacitor C1 and the second capacitor C2. That is, the third capacitor C3 differs from the fourth capacitor C4 and the fifth capacitor C5 with respect to the first capacitor C1 and the second capacitor C2 in arrangement.

The matching circuit 100a may adjust a mismatch of a transmission impedance due to the asymmetry by adjusting capacitances of the fourth capacitor C4 and the fifth capacitor C5, and may adjust a resonance frequency of the resonance circuit 50a by adjusting a capacitance of the third capacitor C3. That is, when the matching circuit 100a adjusts the capacitances of the fourth capacitor C4 and the fifth capacitor C5 and an inductance of the first inductor L1, impedances of the first terminal T1 and the second terminal T2 may be adjusted to have substantially the same impedance and thus, the mismatch of a transmission impedance due to the asymmetry may be adjusted. In addition, a resonance frequency of the resonance circuit 50a may be determined by the capacitance of the third capacitor C3, inductance of the first inductor L1 and an inductance of a parasitic inductor at the second terminal T2, the resonance frequency of the resonance circuit 50a may be adjusted by adjusting the capacitance of the third capacitor C3.

The attenuation circuit 150a may be connected to the first terminal T1, the second terminal T2, the first reception terminal RX1 and the second reception terminal RX2. The attenuation circuit 150a may include a first attenuation capacitor Catt1 coupled between the first terminal T1 and the first reception terminal RX1 and a second attenuation capacitor Catt2 coupled between the second terminal T2 and the second reception terminal RX2. The attenuation circuit 150a may attenuate a signal induced in the antenna 55 in response to the electromagnetic wave EMW and may provide the attenuated signal to the reader circuit 201 in FIG. 3 through the first reception terminal RX1 and the second reception terminal RX2.

The first attenuation capacitor Catt1 and the second attenuation capacitor Catt2 may have a same capacitance (or similar capacitances).

Figure 4B:
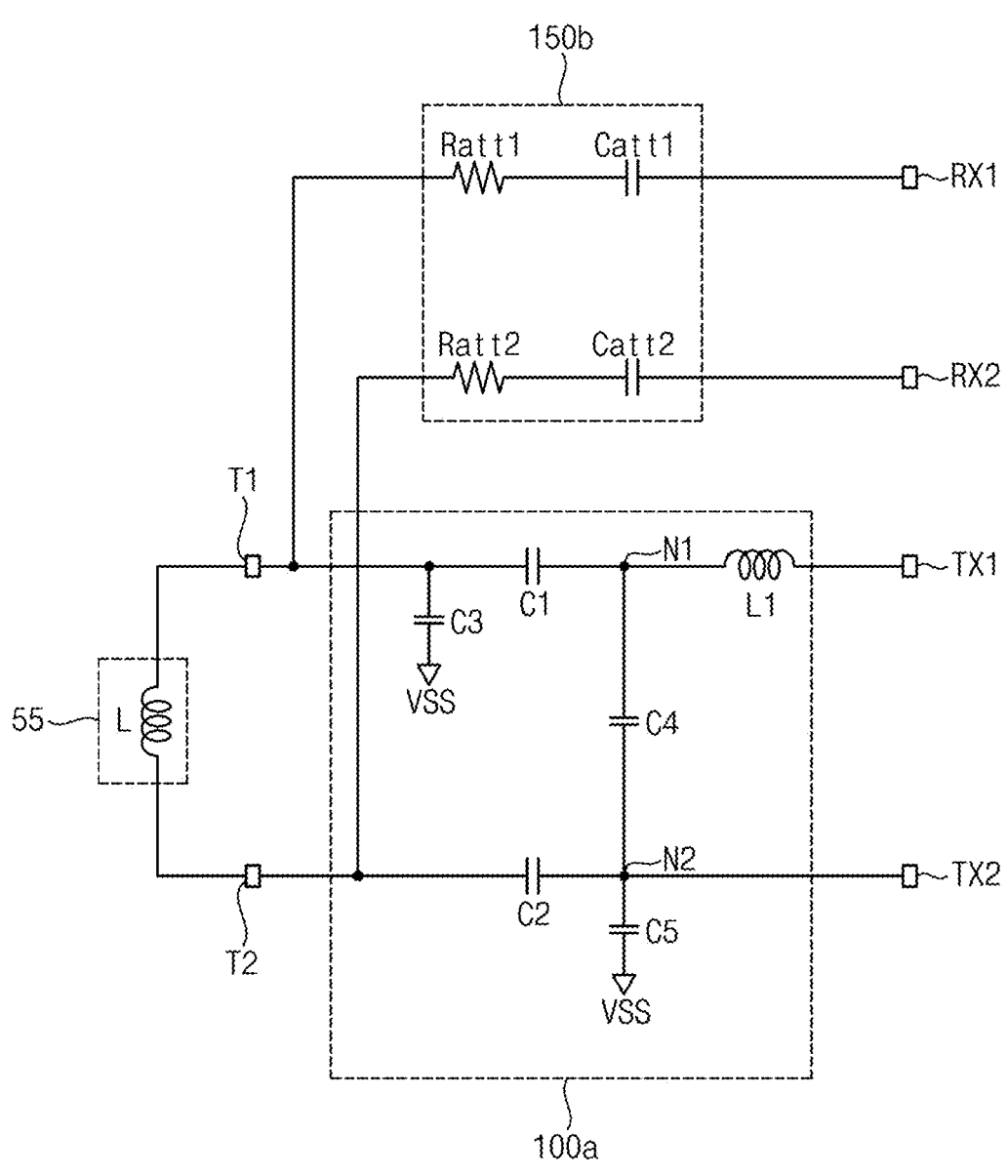
FIG. 4B is a circuit diagram illustrating an example of the resonance circuit in FIG. 2 according to example embodiments.

FIG. 4B is a circuit diagram illustrating an example of the resonance circuit in FIG. 2 according to example embodiments.

Referring to FIG. 4B, a resonance circuit 50ab may include an antenna 55 and the matching circuit 100a. The resonance circuit 50ab may further include an attenuation circuit 150b.

The matching circuit 100a may include first passive elements coupled in series between a first terminal T1 of the antenna 55 and the first transmission terminal TX1, a second passive element directly coupled to a second terminal T2 of the antenna 55 and the second transmission terminal TX2, and third passive elements coupled to the first terminal T1 and the second transmission terminal TX2.

The first passive elements may include a first capacitor C1 and a first inductor L1 coupled in series between the first terminal T1 and the first transmission terminal TX1. The first capacitor C1 and the first inductor L1 may be coupled to each other at a first node N1. The second passive element may include a second capacitor C2 directly coupled between the second terminal T2 and the second transmission terminal TX2. Therefore, the first passive elements and the second passive element may be asymmetric with respect to each other.

In example embodiments, the third passive elements may include a third capacitor C3, a fourth capacitor C4 and a fifth capacitor C5. The third capacitor C3 may be coupled between the first terminal T1 and a ground voltage VSS. The fourth capacitor C4 may be coupled between the first node N1 and a second node N2 to which the second capacitor C4 and the second transmission terminal TX2 are coupled. The fourth capacitor C5 may be coupled between the second node N2 and the ground voltage VSS.

The third capacitor C3 is asymmetric with the fourth capacitor C4 and the fifth capacitor C5 with respect to the first capacitor C1 and the second capacitor C2. That is, the third capacitor C3 differs from the fourth capacitor C4 and the fifth capacitor C5 with respect to the first capacitor C1 and the second capacitor C2 in arrangement.

The matching circuit 100a may adjust a mismatch of a transmission impedance due to the asymmetry by adjusting capacitances of the fourth capacitor C4 and the fifth capacitor C5 and may adjust a resonance frequency of the resonance circuit 50ab by adjusting a capacitance of the third capacitor C3.

The attenuation circuit 150b may be connected to the first terminal T1, the second terminal T2, the first reception terminal RX1 and the second reception terminal RX2. The attenuation circuit 150b may include a first attenuation resistor Ratt1 and a first attenuation capacitor Catt1 coupled in series between the first terminal T1 and the first reception terminal RX1, and a second attenuation resistor Ratt2 and a second attenuation capacitor Catt2 coupled in series between the second terminal T2 and the second reception terminal RX2. The attenuation circuit 150b may attenuate a signal induced in the antenna 55 in response to the electromagnetic wave EMW and may provide the attenuated signal to the reader circuit 201 in FIG. 3 through the first reception terminal RX1 and the second reception terminal RX2. According to example embodiments, the first attenuation capacitor Catt1 and the second attenuation capacitor Catt2 may have a same capacitance (or similar capacitances).

The first attenuation resistor Ratt1 and the second attenuation resistor Ratt2 may have a same resistance (or similar resistances).

Figure 5A:
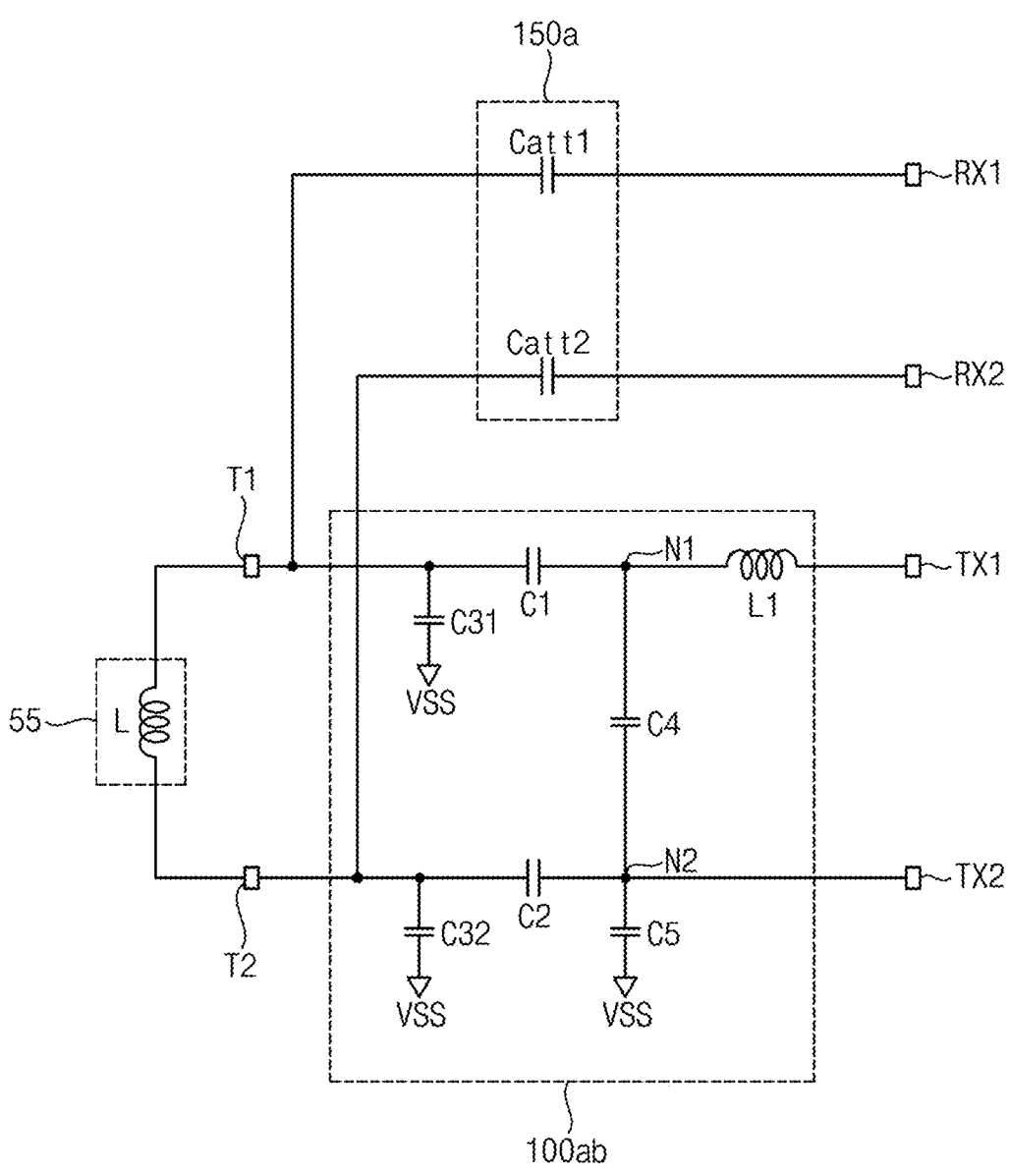
FIG. 5A is a circuit diagram illustrating an example of the resonance circuit in FIG. 2 according to example embodiments.

FIG. 5A is a circuit diagram illustrating an example of the resonance circuit in FIG. 2 according to example embodiments.

Referring to FIG. 5A, a resonance circuit 50b may include an antenna 55 and a matching circuit 100ab. The resonance circuit 50b may further include the attenuation circuit 150a.

Because the resonance circuit 50b of FIG. 5A differs from the resonance circuit 50a of FIG. 4A in a configuration of the matching circuit 100ab, the matching circuit 100ab will be described in detail and descriptions repeated with FIG. 4A will be omitted.

The matching circuit 100ab may include first passive elements coupled in series between a first terminal T1 of the antenna 55 and the first transmission terminal TX1, a second passive element directly coupled to a second terminal T2 of the antenna 55 and the second transmission terminal TX2, and third passive elements coupled to the first terminal T1 and the second transmission terminal TX2.

The first passive elements may include a first capacitor C1 and a first inductor L1 coupled in series between the first terminal T1 and the first transmission terminal TX1. The first capacitor C1 and the first inductor L1 may be coupled to each other at a first node N1. The second passive element may include a second capacitor C2 directly coupled between the second terminal T2 and the second transmission terminal TX2. Therefore, the first passive elements and the second passive element may be asymmetric with respect to each other.

In example embodiments, the third passive elements may include a third capacitor C31, a fourth capacitor C4, a fifth capacitor C5 and a sixth capacitor C32. The third capacitor C31 may be coupled between the first terminal T1 and a ground voltage VSS. The fourth capacitor C4 may be coupled between the first node N1 and a second node N2 to which the second capacitor C4 and the second transmission terminal TX2 are coupled. The fifth capacitor C5 may be coupled between the second node N2 and the ground voltage VSS. The sixth capacitor C32 may be coupled between the second terminal T2 and the ground voltage VSS. The third capacitor C31 and the sixth capacitor C32 may have a same capacitance (or similar capacitances).

The third capacitor C31 is asymmetric with the fourth capacitor C4 and the fifth capacitor C5 with respect to the first capacitor C1 and the second capacitor C2. That is, the third capacitor C31 differs from the fourth capacitor C4 and the fifth capacitor C5 with respect to the first capacitor C1 and the second capacitor C2 in arrangement.

The matching circuit 100a may adjust a mismatch of a transmission impedance due to the asymmetry by adjusting capacitances of the fourth capacitor C4 and the fifth capacitor C5 and may adjust a resonance frequency of the resonance circuit 50a by adjusting a capacitance of the third capacitor C31.

Figure 5B:
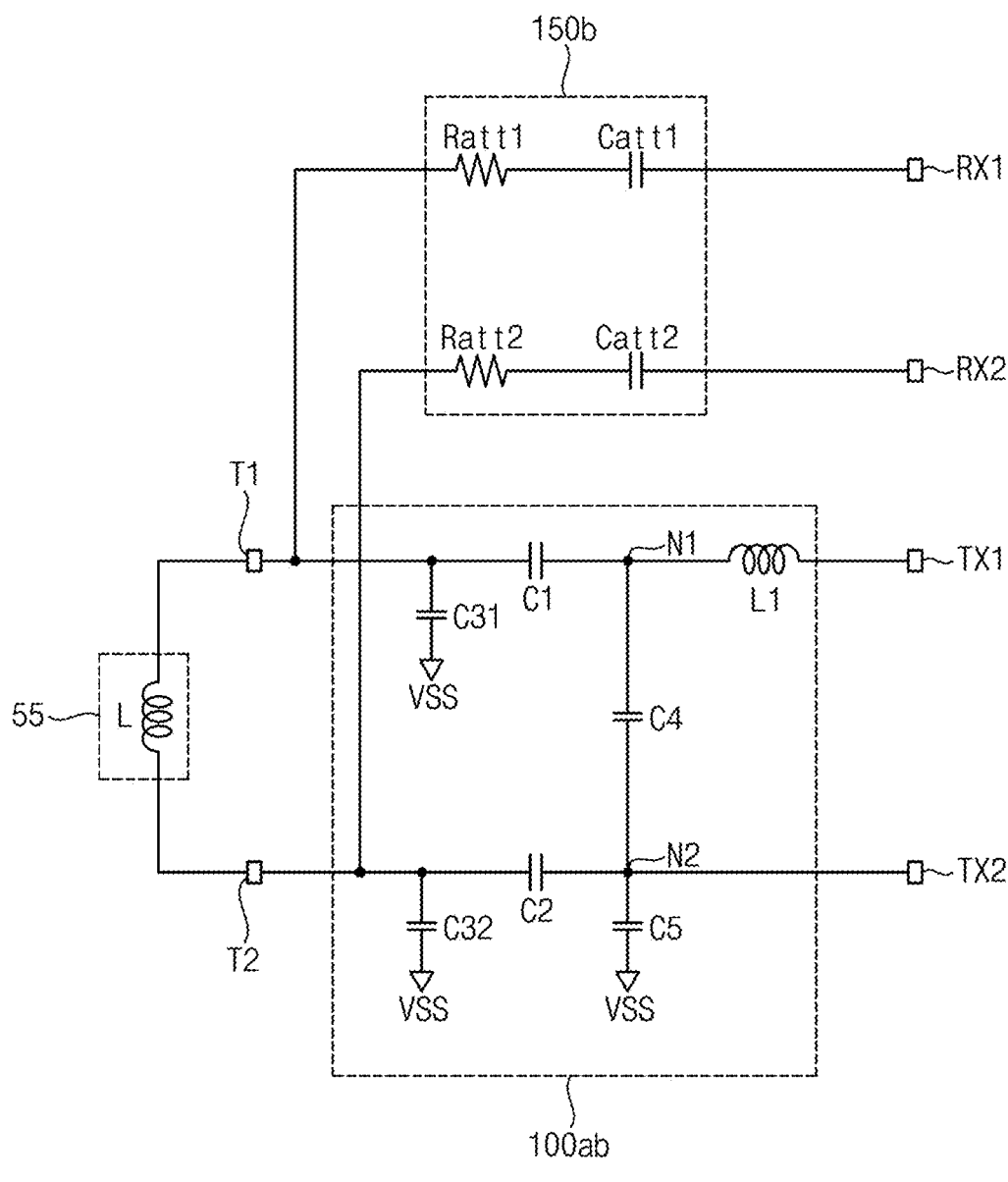
FIG. 5B is a circuit diagram illustrating an example of the resonance circuit in FIG. 2 according to example embodiments.

FIG. 5B is a circuit diagram illustrating an example of the resonance circuit in FIG. 2 according to example embodiments.

Referring to FIG. 5B, a resonance circuit 50ba may include an antenna 55, the matching circuit 100ab and the attenuation circuit 150b.

Because the resonance circuit 50ba of FIG. 5B differs from the resonance circuit 50b of FIG. 5A in a configuration of the attenuation circuit 150b, the attenuation circuit 150b will be described in detail and descriptions repeated with FIG. 5A will be omitted.

The attenuation circuit 150b may be connected to the first terminal T1, the second terminal T2, the first reception terminal RX1 and the second reception terminal RX2. The attenuation circuit 150a may include a first attenuation resistor Ratt1 and a first attenuation capacitor Catt1 coupled in series between the first terminal T1 and the first reception terminal RX1 and a second attenuation resistor Ratt2 and a second attenuation capacitor Catt2 coupled in series between the second terminal T2 and the second reception terminal RX2. The attenuation circuit 150a may attenuate a signal induced in the antenna 15 in response to the electromagnetic wave EMW and may provide the attenuated signal to the reader circuit 201 in FIG. 3 through the first reception terminal RX1 and the second reception terminal RX2.

The first attenuation resistor Ratt1 and the second attenuation resistor Ratt2 may have a same resistance (or similar resistances).

Figure 6:
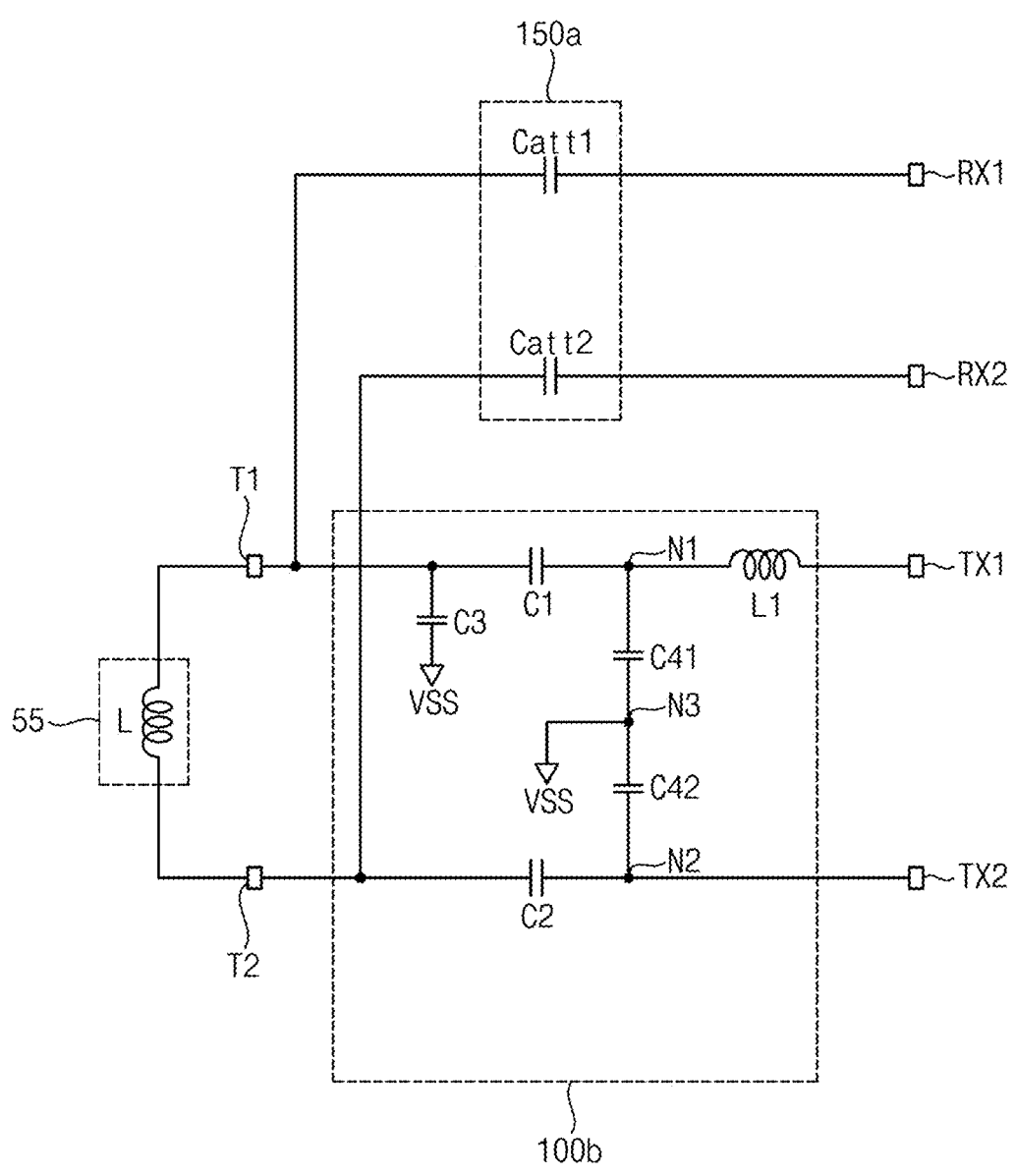
FIG. 6 is a circuit diagram illustrating an example of the resonance circuit in FIG. 2 according to example embodiments.

FIG. 6 is a circuit diagram illustrating an example of the resonance circuit in FIG. 2 according to example embodiments.

Referring to FIG. 6, a resonance circuit 50c may include an antenna 55, a matching circuit 100b and the attenuation circuit 150a.

Because the resonance circuit 50c of FIG. 6 differs from the resonance circuit 50a of FIG. 4A in a configuration of the matching circuit 100b, the matching circuit 100b will be described in detail and descriptions repeated with FIG. 4A will be omitted.

The matching circuit 100b may include first passive elements coupled in series between a first terminal T1 of the antenna 55 and the first transmission terminal TX1, a second passive element directly coupled to a second terminal T2 of the antenna 55 and the second transmission terminal TX2, and third passive elements coupled to the first terminal T1 and the second transmission terminal TX2.

The first passive elements may include a first capacitor C1 and a first inductor L1 coupled in series between the first terminal T1 and the first transmission terminal TX1. The first capacitor C1 and the first inductor L1 may be coupled to each other at a first node N1. The second passive element may include a second capacitor C2 directly coupled between the second terminal T2 and the second transmission terminal TX2. Therefore, the first passive elements and the second passive element may be asymmetric with respect to each other.

In example embodiments, the third passive elements may include a third capacitor C3, a fourth capacitor C41 and a fifth capacitor C42. The third capacitor C3 may be coupled between the first terminal T1 and a ground voltage VSS. The fourth capacitor C41 may be coupled between the first node N1 and the ground voltage VSS and the fourth capacitor C41 may be coupled between the ground voltage VSS and a second node N2 to which the second capacitor C2 and the second transmission terminal TX2 are coupled. The fourth capacitor C41 and the fifth capacitor C42 may be coupled to the ground voltage VSS at a third node N3.

The third capacitor C3 is asymmetric with the fourth capacitor C41 and the fifth capacitor C42 with respect to the first capacitor C1 and the second capacitor C2. That is, the third capacitor C3 differs from the fourth capacitor C41 and the fifth capacitor C42 with respect to the first capacitor C1 and the second capacitor C2 in arrangement.

The matching circuit 100b may adjust a mismatch of a transmission impedance due to the asymmetry by adjusting capacitances of the fourth capacitor C41 and the fifth capacitor C42 and may adjust a resonance frequency of the resonance circuit 50c by adjusting a capacitance of the third capacitor C3.

Figure 7:
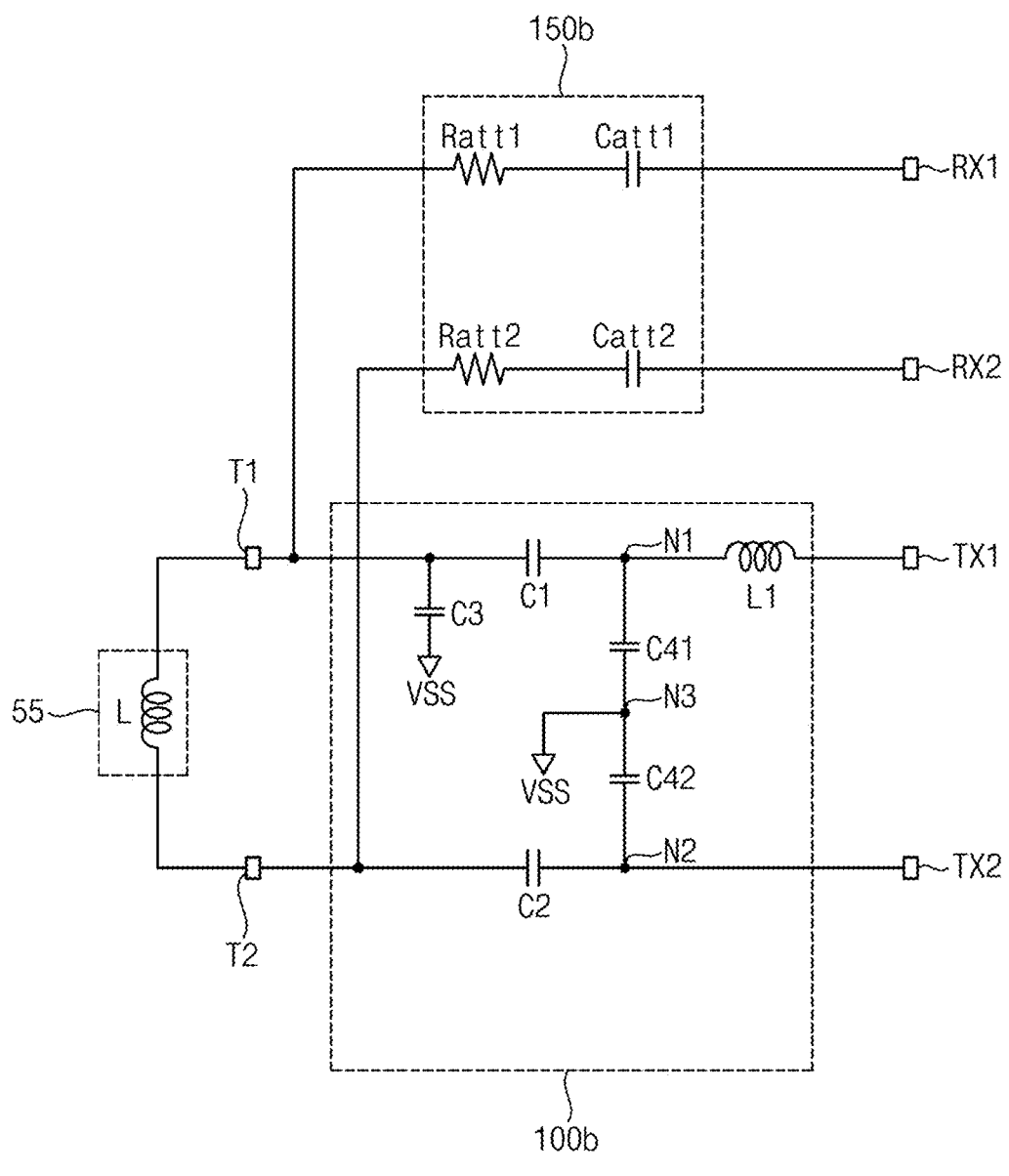
FIG. 7 is a circuit diagram illustrating an example of the resonance circuit in FIG. 2 according to example embodiments.

FIG. 7 is a circuit diagram illustrating an example of the resonance circuit in FIG. 2 according to example embodiments.

Referring to FIG. 7, a resonance circuit 50d may include an antenna 55, the matching circuit 100b and the attenuation circuit 150b.

The matching circuit 100b may include first passive elements coupled in series between a first terminal T1 of the antenna 55 and the first transmission terminal TX1, a second passive element directly coupled to a second terminal T2 of the antenna 55 and the second transmission terminal TX2, and third passive elements coupled to the first terminal T1 and the second transmission terminal TX2.

The first passive elements may include a first capacitor C1 and a first inductor L1 coupled in series between the first terminal T1 and the first transmission terminal TX1. The first capacitor C1 and the first inductor L1 may be coupled to each other at a first node N1. The second passive element may include a second capacitor C2 directly coupled between the second terminal T2 and the second transmission terminal TX2. Therefore, the first passive elements and the second passive element may be asymmetric with respect to each other.

In example embodiments, the third passive elements may include a third capacitor C3, a fourth capacitor C41 and a fifth capacitor C42. The third capacitor C3 may be coupled between the first terminal T1 and a ground voltage VSS. The fourth capacitor C41 may be coupled between the first node N1 and the ground voltage VSS and the fourth capacitor C41 may be coupled between the ground voltage VSS and a second node N2 to which the second capacitor C2 and the second transmission terminal TX2 are coupled. The fourth capacitor C41 and the fifth capacitor C42 may be coupled to the ground voltage VSS at a third node N3.

The attenuation circuit 150b may be connected to the first terminal T1, the second terminal T2, the first reception terminal RX1 and the second reception terminal RX2. The attenuation circuit 150a may include a first attenuation resistor Ratt1 and a first attenuation capacitor Catt1 coupled in series between the first terminal T1 and the first reception terminal RX1 and a second attenuation resistor Ratt2 and a second attenuation capacitor Catt2 coupled in series between the second terminal T2 and the second reception terminal RX2. The attenuation circuit 150a may attenuate a signal induced in the antenna 15 in response to the electromagnetic wave EMW and may provide the attenuated signal to the reader circuit 201 in FIG. 3 through the first reception terminal RX1 and the second reception terminal RX2.

Although an inductor is not coupled between the second node N2 and the second transmission terminal TX2 in each of the resonance circuits 50a, 50ab, 50b, 50ba, 50c and 50d of FIGS. 4A through 7, a parasitic inductance exists in a portion of the second transmission terminal TX2 in each of the resonance circuits 50a, 50ab, 50b, 50ba, 50c and 50d of FIGS. 4A through 7, each of the resonance circuits 50a, 50ab, 50b, 50ba, 50c and 50d of FIGS. 4A through 7 may operate normally and may increase power of transmission signals in a signal transmission operation of the reader mode.

Figure 8:
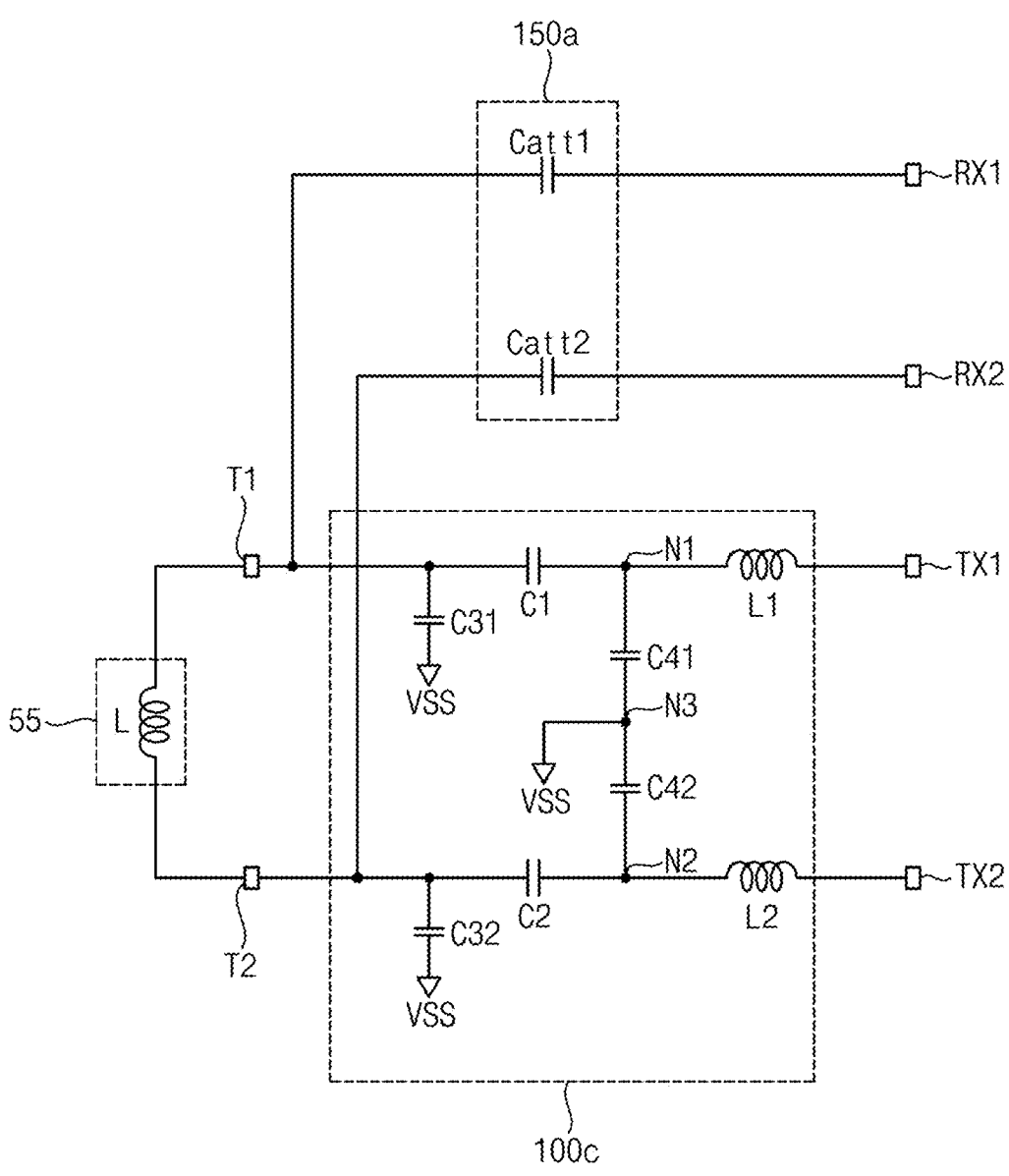
FIG. 8 is a circuit diagram illustrating an example of the resonance circuit in FIG. 2 according to example embodiments.

FIG. 8 is a circuit diagram illustrating an example of the resonance circuit in FIG. 2 according to example embodiments.

Referring to FIG. 8, a resonance circuit 50e may include an antenna 55, a matching circuit 100c and the attenuation circuit 150a.

The matching circuit 100c may include first passive elements coupled in series between a first terminal T1 of the antenna 55 and the first transmission terminal TX1, a second passive elements directly coupled to a second terminal T2 of the antenna 55 and the second transmission terminal TX2, and third passive elements coupled to the first terminal T1 and the second transmission terminal TX2.

The first passive elements may include a first capacitor C1 and a first inductor L1 coupled in series between the first terminal T1 and the first transmission terminal TX1. The first capacitor C1 and the first inductor L1 may be coupled to each other at a first node N1. The second passive elements may include a second capacitor C2 and a second inductor L2 coupled in series between the second terminal T2 and the second transmission terminal TX2. The second capacitor C2 and the second inductor L2 may be coupled to each other at a second node N2.

In example embodiments, the third passive elements may include a third capacitor C31, a fourth capacitor C32, a fifth capacitor C41 and a sixth capacitor C42. The third capacitor C31 may be coupled between the first terminal T1 and a ground voltage VSS. The fourth capacitor C32 may be coupled between the second terminal T2 and the ground voltage VSS. The fifth capacitor C41 may be coupled between the first node N1 and the ground voltage VSS and the sixth capacitor C42 may be coupled between the ground voltage VSS and the second node N2 to which the second capacitor C2 and the second transmission terminal TX2 are coupled. The fifth capacitor C41 and the sixth capacitor C42 may be coupled to the ground voltage VSS at a third node N3. According to example embodiments, the fifth capacitor C41 and the sixth capacitor C42 may have the same capacitance (or similar capacitances).

The attenuation circuit 150a may be connected to the first terminal T1, the second terminal T2, the first reception terminal RX1 and the second reception terminal RX2. The attenuation circuit 150a may include a first attenuation capacitor Catt1 coupled between the first terminal T1 and the first reception terminal RX1 and a second attenuation capacitor Catt2 coupled between the second terminal T2 and the second reception terminal RX2. The attenuation circuit 150a may attenuate a signal induced in the antenna 55 in response to the electromagnetic wave EMW and may provide the attenuated signal to the reader circuit 201 in FIG. 3 through the first reception terminal RX1 and the second reception terminal RX2.

Figure 9:
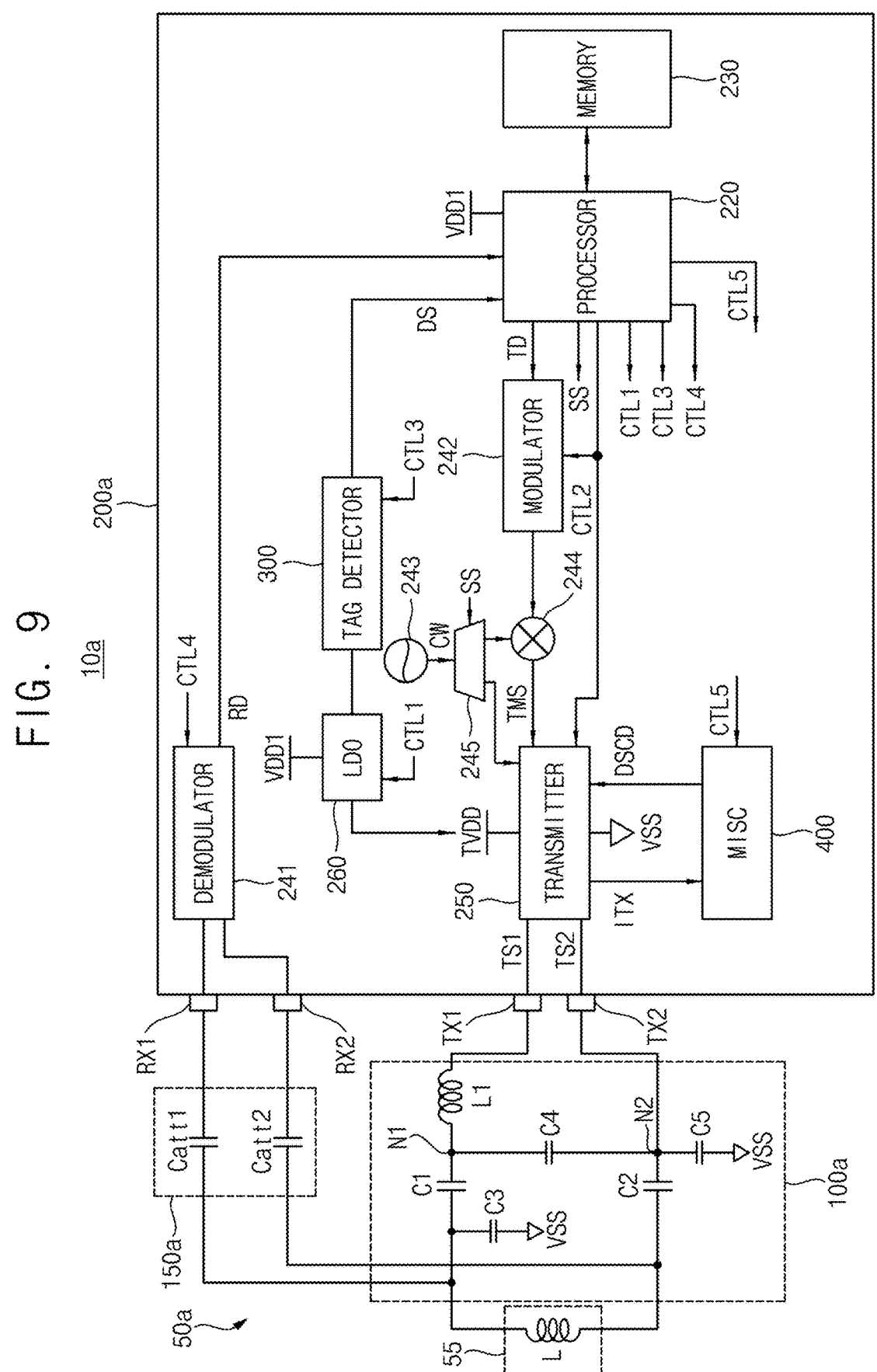
FIG. 9 is a block diagram illustrating an example of the NFC device in FIG. 1 according to example embodiments.

FIG. 9 is a block diagram illustrating an example of the NFC device in FIG. 1 according to example embodiments.

Only elements to operate an NFC device 10a in the reader mode are illustrated in FIG. 9 and elements to operate the NFC device 10a in the card mode are omitted in FIG. 9.

Referring to FIG. 9, the NFC device 10a may include the resonance circuit 50a and an NFC chip 200a. The resonance circuit 50a may include the antenna 55, the matching circuit 100a and the attenuation circuit 150a.

Descriptions of configuration and operation on the resonance circuit 50a are repeated with FIG. 4A and will be omitted.

The NFC chip 200a may be connected to the resonance circuit 50a through the first transmission terminal TX1, the second transmission terminal TX2, the first reception terminal RX1 and the second reception terminal RX2.

The NFC chip 200a may perform (signal) transmission operation through the first and second transmission terminals TX1 and TX1 in an active mode and may perform (signal) reception operation through the first and second reception terminals RX1 and RX2 in the active mode. The NFC chip 200a may set a modulation index automatically and may perform detection operation in a stand-by mode.

The NFC chip 200a may include a processor 220, a memory 230, a demodulator 241, a modulator 242, an oscillator 243, a mixer 244, a demultiplexer 245, a transmitter 250, a regulator 260, a tag detector 300 and/or a modulation index setting circuit (MISC) 400.

The processor 220 may control the overall operation of the NFC chip 200a. The processor 220 may operate by receiving a first supply voltage VDD1 from a power source, such as a battery. When the signal reception operation is performed in the active mode, the demodulator 241 may generate reception data RD by demodulating the signal supplied from the resonance circuit 50a through the first and second reception terminals RX1 and RX2 to provide the reception data RD to the processor 220. According to example embodiments, the demodulator 241 may generate the reception data RD based on a control signal CTL4 received from the processor 220 indicating that the NFC chip 200a in the active mode and/or that a signal reception operation is to be performed. The processor 220 may store the reception data RD in the memory 230.

When the signal transmission operation is performed in the active mode, the processor 220 may read out transmission data TD from the memory 230 to provide the transmission data TD to the modulator 242, and the modulator 242 may modulate the transmission data TD to provide a modulation signal. According to example embodiments, the modulator 242 may modulate the transmission data TD based on a control signal CTL2 received from the processor 220 indicating that the NFC chip 200a in the active mode and/or that a signal transmission operation is to be performed. In addition, the oscillator 243 may generate a carrier signal CW having a frequency corresponding to a carrier frequency (for example, 13.56 MHz), the demultiplexer 245 may provide the carrier signal CW to the mixer 244 in response to a selection signal SS, and the mixer 244 may combine the carrier signal CW with the modulated signal to generate a transmission modulation signal TMS.

In each of a preset phase and a detection phase of the stand-by mode, the demultiplexer 245 may provide the carrier signal CW to the transmitter 250 in response to the selection signal SS from the processor 220 and the transmitter 250 may generate first and second transmission signals TS1 and TS2 based on the carrier signal CW to perform a detection operation for an external NFC device. According to example embodiments, the term "preset phase" as used herein refers to a specific phase of the stand-by mode and does not refer to a timing (e.g., coming before) with respect to, for example, other phases and/or operations.

The transmitter 250 may be connected between a transmission power supply voltage TVDD and a ground voltage

US 12,573,998 B2

13

GND. The transmitter 250 may receive the carrier signal CW from the demultiplexer 245 in the stand-by mode and generate the first and second transmission signals TS1 and TS2 corresponding to the carrier signal CW. In addition, the transmitter 250 may receive the transmission modulation signal TMS from the mixer 244 in the active mode and the resonance circuit 50*a* may generate the electromagnetic wave EMW corresponding to the first and second transmission signals TS1 and TS2 provided from the transmitter 250 through the first and second transmission terminals TX1 and TX2. For example, the transmitter 250 may allow the first and second transmit terminals TX1 and TX2 to be connected to either the transmission power supply voltage TVDD through a pull-up load or the ground voltage GND through pull-down load based on the transmission modulation signal TMS in the active mode, so that the first and second transmission signals TS1 and TS2 may be provided to the resonance circuit 50*a* through the first and second transmit terminals TX1 and TX2.

The processor 220 may provide the transmitter 250 with a control signal CTL2 having a plurality of bits indicating a mode and operation of the NFC device 10*a* based on the mode and the operation of the NFC device 10*a*. In addition, the processor 220 may control operation of the modulation index setting circuit 400 by providing a control signal CTL5 to the modulation index setting circuit 400.

The regulator 260 may be connected to the first power supply voltage VDD1 and may provide the transmission power supply voltage TVDD to the transmitter 250. The regulator 260 may be implemented with a low drop-out (LDO) regulator and may adjust a level of the transmission power supply voltage TVDD in response to a control signal CTL1 from the processor 220.

The tag detector 300 may be connected to the regulator 260, may monitor a current (regulator current) flowing in the regulator 260 when the electromagnetic wave EMW is radiated through the resonance circuit 50*a* respectively in a preset phase and a detection phase, and may determine whether the external NFC device is within a communication range of the NFC device 10*a* based on a comparison of a first sensing current in the preset phase and a second sensing current in the detection phase.

The tag detector 300 may determine whether the external NFC device is within a communication range of the NFC device 10*a* and may output a detection signal DS to the processor 220, which indicates whether the external NFC device is within a communication range of the NFC device 10*a*. The processor 220 may receive the detection signal DS and may determine an operation mode of the NFC device 10*a* based on a logic level of the detection signal DS.

When the external NFC device is out of the communication range of the NFC device 10*a* and the detection signal DS has a first logic level (logic low level), the processor 220 may maintain the operation mode of the NFC device 10*a* as the stand-by mode. When the external NFC device is within the communication range of the NFC device 10*a* and the detection signal DS has a second logic level (logic high level), the processor 220 may change the operation mode of the NFC device 10*a* from the stand-by mode to the active mode.

The modulation index setting circuit 400 may set modulation indexes automatically in response to the control signal CTL5 in the transmission operation in the stand-by mode. The processor may control the transmitter 250 to select a first modulation index of the modulation indexes according to a communication protocol between the external NFC device and the NFC device 10*a* and to have driving strength associated with the selected modulation index. The modulation index setting circuit 400 may apply a driving strength control code DCSD to the transmitter 250, may sequentially change a transmitter current that flows in the transmitter 250, may generate a reference current and a modulation current by detecting the transmitter current (e.g., the transmitter current ITX) that flows in the transmitter 250 respectively in a non-modulation interval and in a modulation interval, may calculate the modulation indexes based on the reference current and the modulation current and may generate a modulation index table (470 in FIG. 13) that stores the modulation index.

Figure 10:
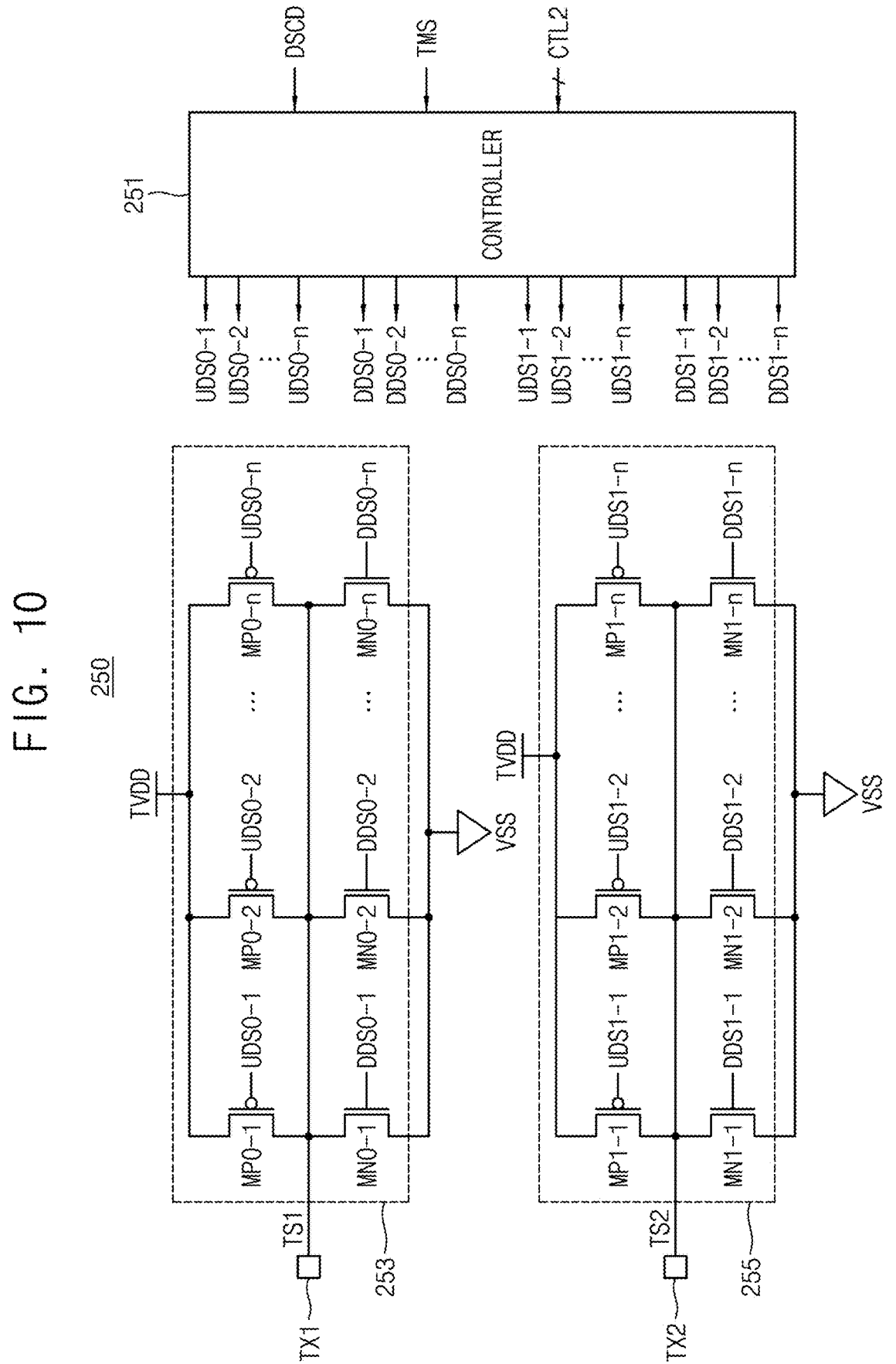
FIG. 10 is a block diagram illustrating an example of the transmitter in the NFC device of FIG. 9 according to example embodiments.

FIG. 10 is a block diagram illustrating an example of the transmitter in the NFC device of FIG. 9 according to example embodiments.

Referring to FIG. 10, the transmitter 250 may include a first driver 253, a second driver 255 and/or a controller 251. The first driver 253 may include a plurality of first pull-up transistors MP0-1, MP0-2, . . . , and MP0-*n* and a plurality of first pull-down transistors MN0-1, MN0-2, . . . , and MN0-*n*. The second driver 255 may include a plurality of second pull-up transistors MP1-1, MP1-2, . . . , and MP1-*n* and a plurality of second pull-down transistors MN1-1, MN1-2, . . . , and MN1-*n*.

The first pull-up transistors MP0-1, MP0-2, . . . , and MP0-*n* and the second pull-up transistors MP1-1, MP1-2, . . . , and MP1-*n* may be PMOS transistors (e.g., p-channel metal-oxide-semiconductor field effect transistors), and the first pull-down transistors MN0-1, MN0-2, . . . , and MN0-*n* and the second pull-down transistors MN1-1, MN1-2, . . . , and MN1-*n* may be the NMOS transistors (e.g., n-channel metal-oxide-semiconductor field effect transistors).

The first pull-up transistors MP0-1, MP0-2, . . . , and MP0-*n* may be connected in parallel between the transmission supply voltage TVDD and the first transmission terminal TX1, and the first pull-down transistors MN0-1, MN0-2, . . . , and MN0-*n* may be connected in parallel between the first transmission terminal TX1 and the ground voltage GND. The second pull-up transistors MP1-1, MP1-2, . . . , and MP1-*n* may be connected in parallel between the transmission supply voltage TVDD and the second transmission terminal TX2 and the second pull-down transistors MN1-1, MN1-2, . . . , and MN1-*n* may be connected in parallel between the second transmission terminal TX2 and the ground voltage GND.

The controller 251 may drive the first pull-up transistors MP0-1, MP0-2, . . . , and MP0-*n* through a plurality of first pull-up driving signals UDS0-1, UDS0-2, . . . , and UDS0-*n*, respectively, drive the first pull-down transistors MN0-1, MN0-2, . . . , and MN0-*n* through a plurality of first pull-down driving signals DDS0-1, DDS0-2, . . . , and DDS0-*n*, respectively, drive the second pull-up transistors MP1-1, MP1-2, . . . , and MP1-*n* through a plurality of second pull-up driving signals UDS1-1, UDS1-2, . . . , and UDS1-*n*, respectively, and drive the second pull-down transistors MN1-1, MN1-2, . . . , and MN1-*n* through a plurality of second pull-down driving signals DDS1-1, DDS1-2, . . . , and DDS1-*n*, respectively. The first pull-up driving signals UDS0-1, UDS0-2, . . . , and UDS0-*n* and the first pull-down driving signals DDS0-1, DDS0-2, . . . , and DDS0-*n* may be referred to as first driving signals. The second pull-up driving signals UDS1-1, UDS1-2, . . . , and UDS1-*n* and the second pull-down driving signals DDS1-1, DDS1-2, . . . , and DDS1-*n* may be referred to as second driving signals.

The controller 251 may determine whether the NFC chip 200a is in the stand-by mode or the active mode based on the control signal CTL2 supplied from the processor 220.

In the stand-by mode, the controller 251 may sequentially turn off the first pull-up transistors MP0-1, MP0-2, . . . , and MP0-n, turn-off the first pull-down transistors MN0-1, MN0-2, . . . , and MN0-n respectively, turn-off the second pull-up transistors MP1-1, MP1-2, . . . , and MP1-n respectively and sequentially turn-off the second pull-down transistors MN1-1, MN1-2, . . . , and MN1-n in response to the driving strength control code DSCD such that current from the transmission power supply voltage TVDD flows to the ground voltage GND through some of the first pull-up transistors MP0-1, MP0-2, . . . , and MP0-n, the first transmission terminal TX1, the matching circuit 100a, the second transmission terminal TX2 and some of the second pull-down transistors MN1-1, MN1-2, . . . , and MN1-n, and a magnitude of the transmitter current ITX may sequentially decrease.

In the stand-by mode, the controller 251 may sequentially turn on the first pull-up transistors MP0-1, MP0-2, . . . , and MP0-n, turn-off the first pull-down transistors MN0-1, MN0-2, . . . , and MN0-n respectively, turn-off the second pull-up transistors MP1-1, MP1-2, . . . , and MP1-n respectively and sequentially turn-on the second pull-down transistors MN1-1, MN1-2, . . . , and MN1-n in response to the driving strength control code DSCD such that current from the transmission power supply voltage TVDD flows to the ground voltage GND through some of the first pull-up transistors MP0-1, MP0-2, . . . , and MP0-n, the first transmission terminal TX1, the matching circuit 100a, the second transmission terminal TX2 and some of the second pull-down transistors MN1-1, MN1-2, . . . , and MN1-n, and a magnitude of the transmitter current ITX may sequentially decrease.

In the active mode, the controller 251 may turn-on the first pull-up transistors MP0-1, MP0-2, . . . , and MP0-n, the first pull-down transistors MN0-1, MN0-2, . . . , and MN0-n, the second pull-up transistors MP1-1, MP1-2, . . . , and MP1-n or the second pull-down transistors MN1-1, MN1-2, . . . , and MN1-n based on the transmission modulation signal TMS and the driving strength control code DSCD.

In addition, the controller 251 may drive the first pull-up transistors MP0-1, MP0-2, . . . , and MP0-n, the second pull-up transistors MP1-1, MP1-2, . . . , and MP1-n, the first pull-down transistors MN0-1, MN0-2, . . . , and MN0-n and the second pull-down transistors MN1-1, MN1-2, . . . , and MN1-n based on the transmission modulation signal TMS and the driving strength control code DSCD asymmetrically in the active mode to perform the transmission operation to provide the first and second transmission signal TS1 and TS2 to the resonance circuit 50a. That is, the controller 251 may drive the first pull-up transistors MP0-1, MP0-2, . . . , and MP0-n, the second pull-up transistors MP1-1, MP1-2, . . . , and MP1-n, the first pull-down transistors MN0-1, MN0-2, . . . , and MN0-n and the second pull-down transistors MN1-1, MN1-2, . . . , and MN1-n asymmetrically in the active mode by activating first driving signals and the second driving signals asymmetrically. That is, the controller 251 may activate different numbers of transistors in the first pull-up transistors MP0-1, MP0-2, . . . , and MP0-n, the second pull-up transistors MP1-1, MP1-2, . . . , and MP1-n, the first pull-down transistors MN0-1, MN0-2, . . . , and MN0-n and in the second pull-up transistors MP1-1, MP1-2, . . . , and MP1-n, the first pull-down transistors MN0-1, MN0-2, . . . , and MN0-n and the second pull-down transistors MN1-1, MN1-2, . . . , and MN1-n by activating the first driving signals and the second driving signals asymmetrically.

Figure 11:
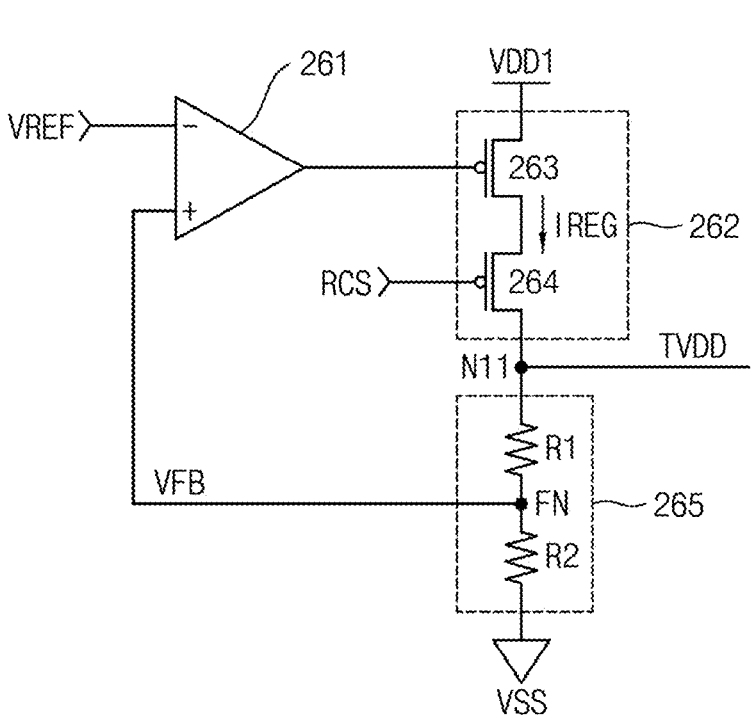
FIG. 11 is a circuit diagram illustrating an example of the regulator in the NFC device of FIG. 9 according to example embodiments.

FIG. 11 is a circuit diagram illustrating an example of the regulator in the NFC device of FIG. 9 according to example embodiments.

Referring to FIG. 11, the regulator 260 may include an operational amplifier 261, a current generator 262 and/or a feedback unit 265.

The operational amplifier 261 has a first (negative) input terminal receiving a reference voltage VREF, a second (positive) input terminal receiving a feedback voltage VFB and an output terminal. The operational amplifier 261 may compare the reference voltage VREF and the feedback voltage VFB to provide the current generator 262 with an output indicating a result of comparison of the reference voltage VREF and the feedback voltage VFB through the output terminal.

The current generator 262 may include a first PMOS transistor 263 and a second PMOS transistor 264 which are connected in series between the first power supply voltage VDD1 and an output node N11. The first PMOS transistor 263 has a source connected to the first power supply voltage VDD1 and a gate connected to the output terminal of the operational amplifier 261. The second PMOS transistor 264 has a source connected to a drain of the first PMOS transistor 263, a gate receiving a regulator control signal RCS and a drain connected to the output node N11. The transmission power supply voltage TVDD which is applied to the transmitter 250 is output at the output node N11.

A regulator current IREG flows from the first power supply voltage VDD1 to the output node N11 through the first and second PMOS transistors 263 and 264, and a magnitude of the regulator current IREG may be adjusted according to the regulator control signal RCS that may be included in the control signal CTL1. The feedback unit 265 may include a first resistor R1 and a second resistor R2 connected in series between the output node N11 and the ground voltage GND. The first and second resistors R1 and R2 are connected to each other at a feedback node FN, and the feedback voltage VFB is provided to the second input terminal of the operational amplifier 261. The transmission power supply voltage TVDD is voltage-divided to the feedback voltage VFB by the first and second resistors R1 and R2.

Figure 12:
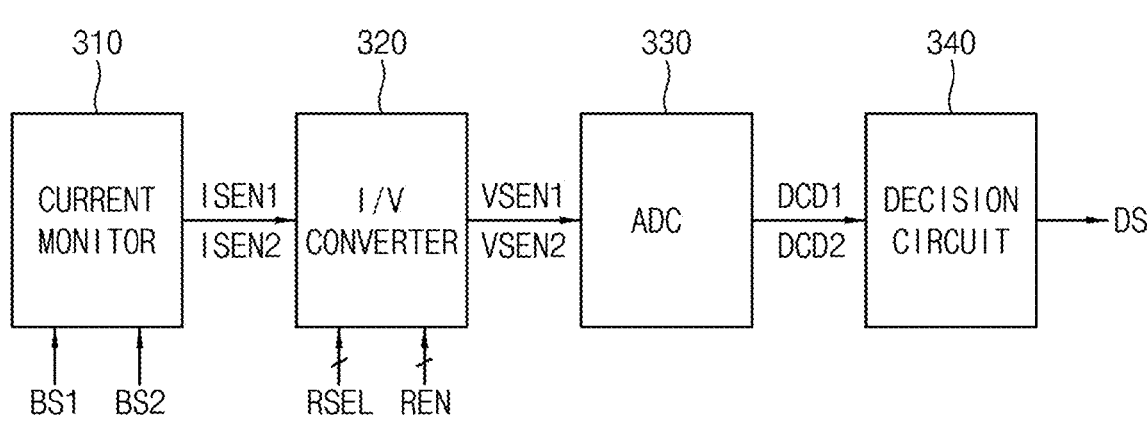
FIG. 12 is a block diagram illustrating an example of the tag detector in the NFC device of FIG. 9 according to example embodiments.

FIG. 12 is a block diagram illustrating an example of the tag detector in the NFC device of FIG. 9 according to example embodiments.

Referring to FIG. 12, the tag detector 300 may include a current monitor 310, a current to voltage (I/V) converter 320, an analog to digital converter (ADC) 330 and/or a decision circuit 340.

The current monitor 310 may be connected to the output terminal of the operational amplifier 261 and generates a first sensing current ISEN1 and a second sensing current ISEN2 by monitoring the regulator current IREG flowing in the regulator 260 respectively in the preset phase and in the detection phase. The current monitor 310 may generate the first sensing current ISEN1 and the second sensing current ISEN2 respectively in the preset phase and in the detection phase by receiving a first bias signal BS1 and a second bias signal BS2.

The current to voltage converter 320 may convert the first sensing current ISEN1 and the second sensing current ISEN2 to a first sensing voltage VSEN1 and a second sensing voltageVSEN2, respectively, in the preset phase and in the detection phase.

The ADC 330 may convert the first sensing voltage VSEN1 and the second sensing voltage to a first digital code DCD1 and a second digital code DCD2, respectively, in the preset phase and in the detection phase.

The decision circuit 340 may output the detection signal DS to the processor 220, which may indicate that the external NFC device is within a communication range of the NFC device 10a based on a comparison of the first digital code DCD1 and the second digital code DCD2.

Figure 13:
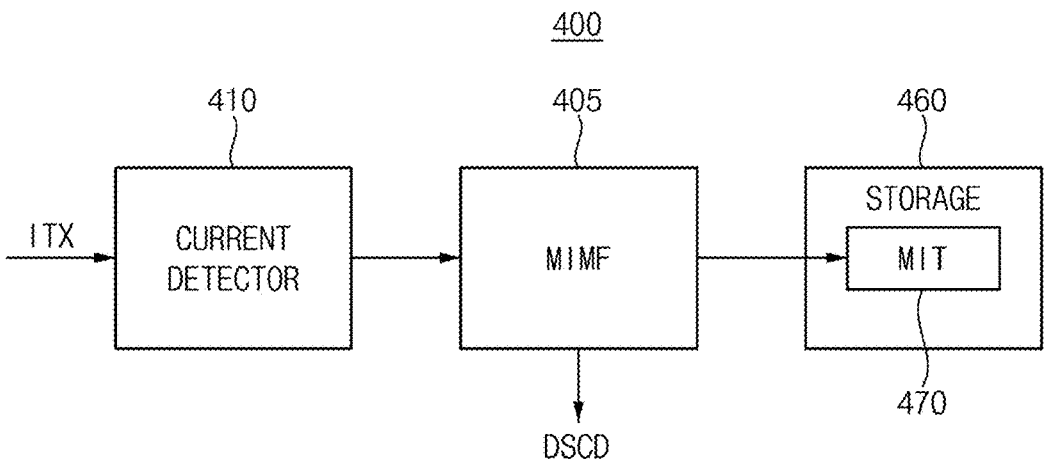
FIG. 13 is a block diagram illustrating an example of the modulation index setting circuit in the NFC device of FIG. 9 according to example embodiments.

FIG. 13 is a block diagram illustrating an example of the modulation index setting circuit in the NFC device of FIG. 9 according to example embodiments.

Referring to FIG. 13, the modulation index setting circuit 400 may include a modulation index management firmware (MIMF) 405, a current detector 410 and/or a storage device 460.

The current detector 410 may generate the reference current and the modulation current by detecting a transmitter current ITX that flows in the transmitter 250 respectively in the non-modulation interval and in the modulation interval. The modulation index management firmware 405 may change the transmitter current ITX that flows in the transmitter 250 by applying the driving strength control code DSCD, may receive the reference current and the modulation current, may calculate the modulation indexes associated code values of the driving strength control code DSCD and may generate a modulation index table MIT 470 that stores the modulation indexes MI. The storage device 460 may store the modulation index management firmware 405 and the modulation index table 470. The storage device 460 may be a flash memory.

Figure 14:
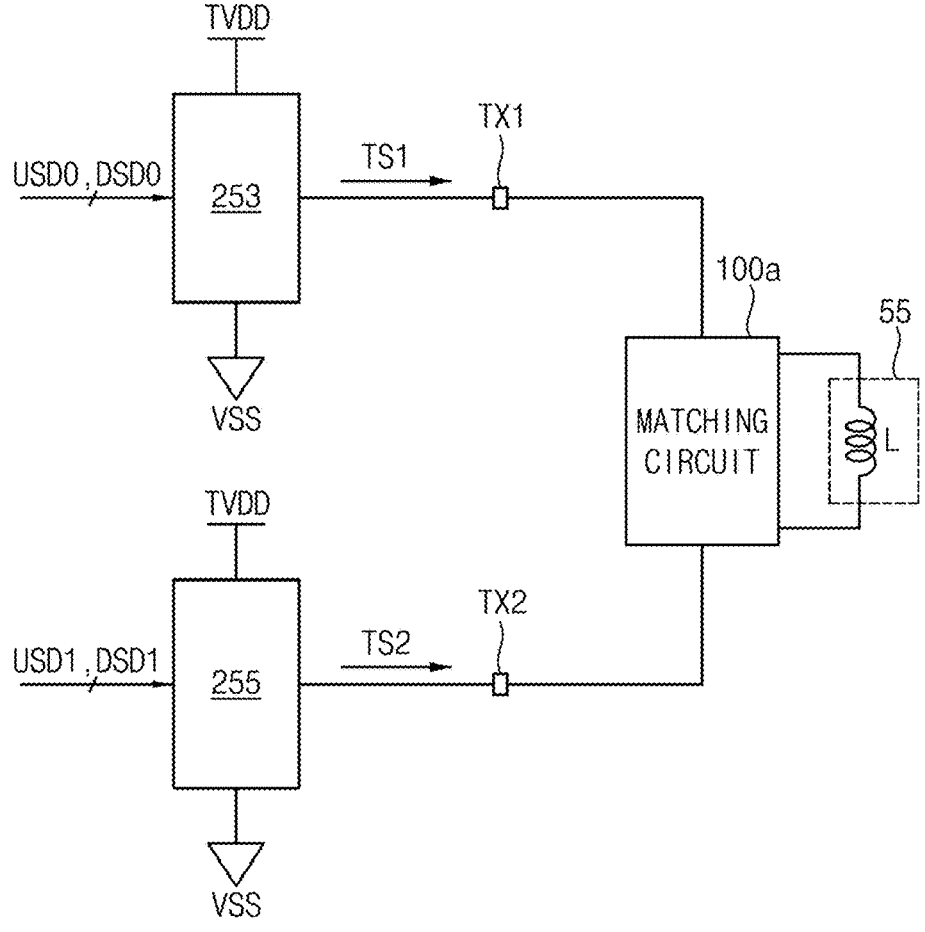
FIG. 14 illustrates a portion of the NFC device of FIG. 9.

FIG. 14 illustrates a portion of the NFC device of FIG. 9.

Referring to FIGS. 9, 10 and 14, when the first driver 253 of the transmitter 250 applies the first transmission signal TS1 to the matching circuit 100a through the first transmission terminal TX1 and the second driver 255 of the transmitter 250 applies the second transmission signal TS2 to the matching circuit 100a through the second transmission terminal TX2, a current flows in the antenna 55. A power of a transmission operation in the read mode may be measured by the current flowing in the antenna 55.

Figure 15:
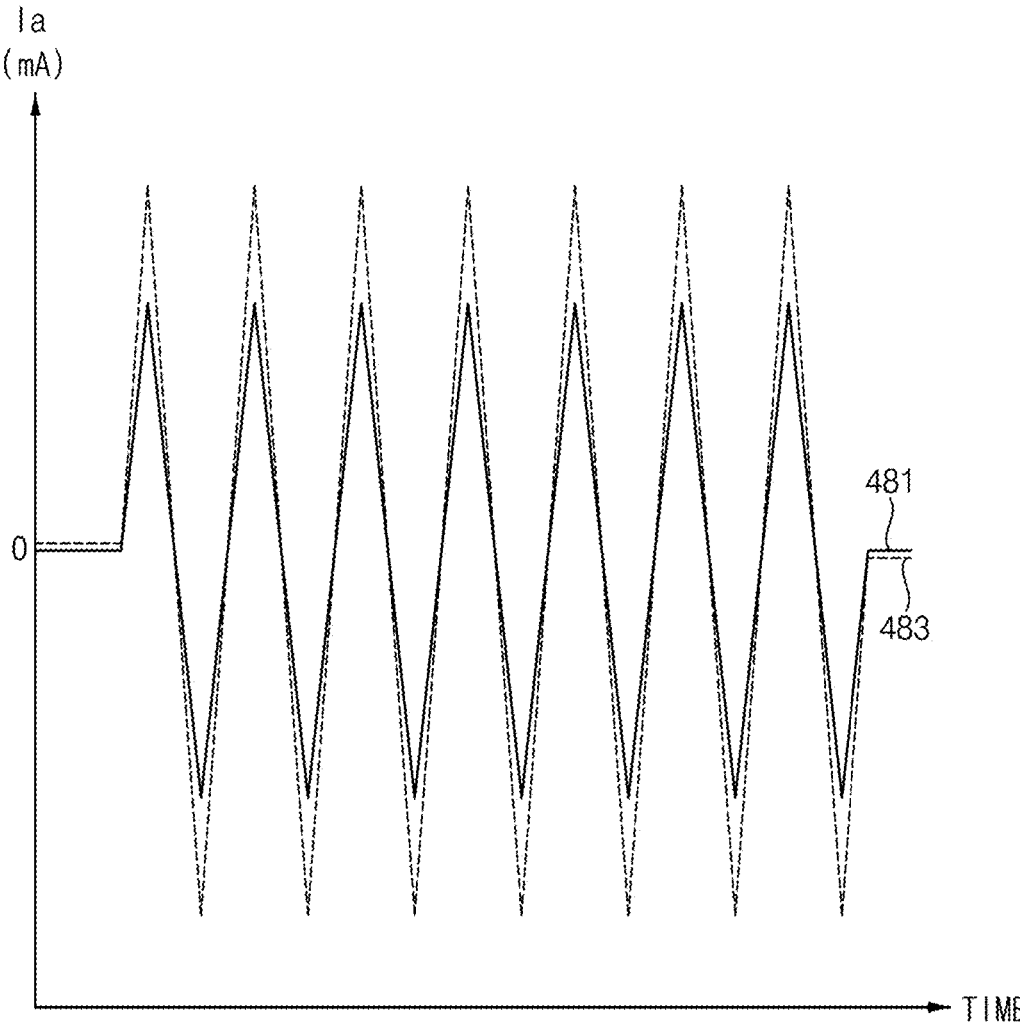
FIG. 15 is a graph illustrating a current flowing in the antenna of the NFC device of FIG. 14.

FIG. 15 is a graph illustrating a current flowing in the antenna of the NFC device of FIG. 14.

In FIG. 15, a reference numeral 481 indicates a first current flowing in the antenna 55 when the NFC device of FIG. 14 employs a resonance circuit having a symmetric configuration, the first driver 253 of the transmitter 250 applies the first transmission signal TS1 to the matching circuit through the first transmission terminal TX1 and the second driver 255 of the transmitter 250 applies the second transmission signal TS2 to the matching circuit through the second transmission terminal TX2. A reference numeral 483 indicates a second current flowing in the antenna 55 when the NFC device of FIG. 14 employs the resonance circuit 50a having an asymmetric configuration, the first driver 253 of the transmitter 250 applies the first transmission signal TS1 to the matching circuit 100a through the first transmission terminal TX1 and the second driver 255 of the transmitter 250 applies the second transmission signal TS2 to the matching circuit 100a through the second transmission terminal TX2.

Referring to FIG. 15, it is noted that a magnitude of the second current is greater than a magnitude of the first current because the resonance circuit 50a includes the capacitor C2 between the second terminal T2 and the second transmission terminal TX2, and does not include an inductor between the second terminal T2 and the second transmission terminal TX2 as described with reference to FIG. 4A. Therefore, current consumed by the resonance circuit 50a may be reduced.

In FIG. 15, a horizontal axis denotes a time and a vertical axis denotes a current Ia flowing in the antenna 55, and the current Ia has a magnitude represented in mA.

Figure 16:
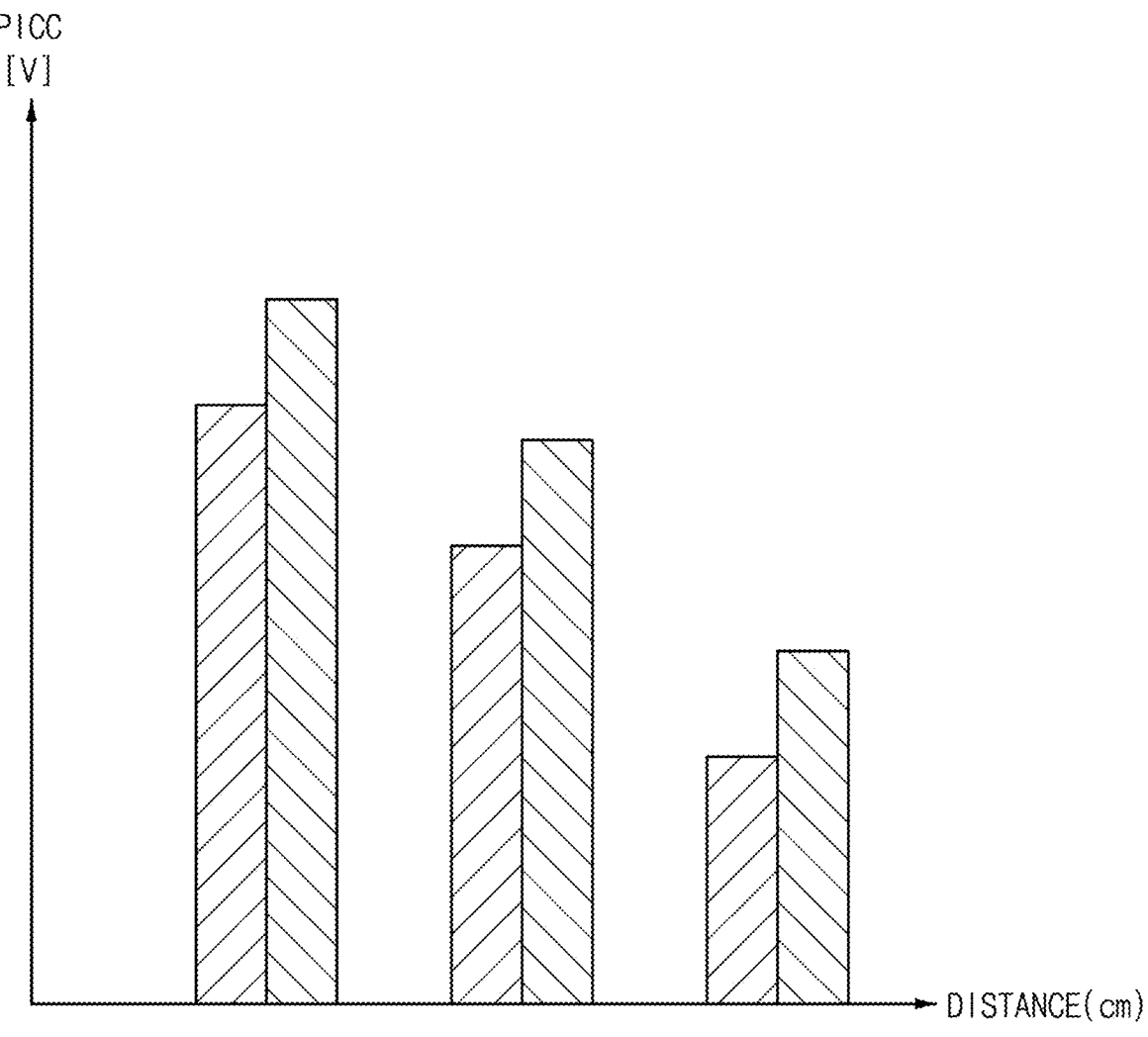
FIG. 16 illustrates a voltage that is induced in a resonance circuit of a reference NFC device according to a distance between the NFC device of FIG. 9 and the reference NFC device when the NFC device of FIG. 9 operates in the reader mode.

FIG. 16 illustrates a voltage that is induced in a resonance circuit of a reference NFC device, according to a distance between the NFC device of FIG. 9 and the reference NFC device, when the NFC device of FIG. 9 operates in the reader mode.

In FIG. 16, a reference numeral 491 indicates a first voltage induced in a resonance circuit of a reference NFC device PICC when the NFC device 10a of FIG. 9 employs a matching circuit having a symmetric configuration, and a reference numeral 493 indicates a second voltage induced in the resonance circuit of the reference NFC device PICC when the NFC device 10a of FIG. 9 employs the matching circuit 100a in FIG. 4A, which has an asymmetric configuration.

Referring to FIG. 16, the second voltage is greater than the first voltage even though a distance between the NFC device 10 and the reference NFC device PICC increases.

Figure 17:
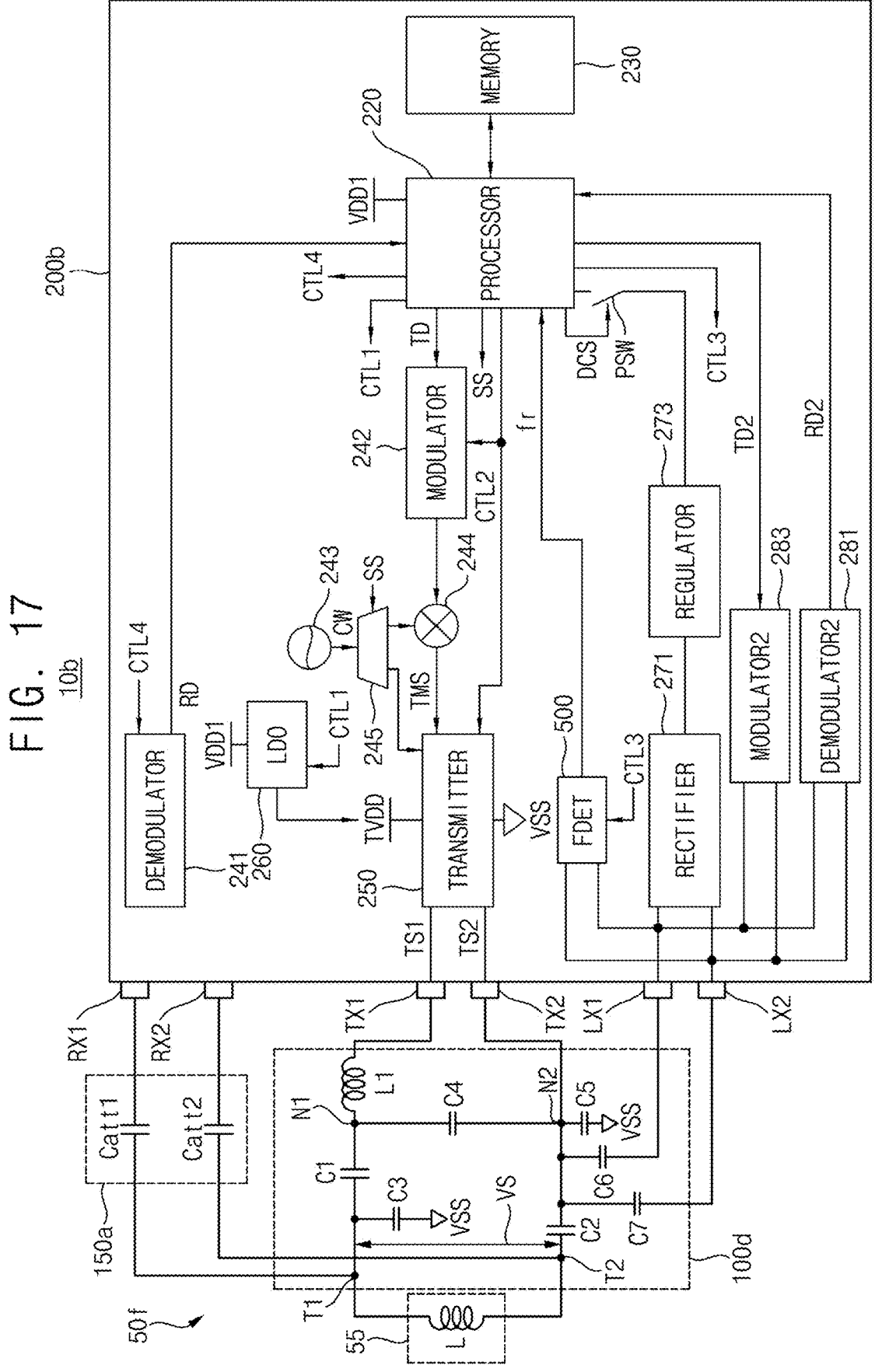
FIG. 17 is a block diagram illustrating an NFC device according to example embodiments.

FIG. 17 is a block diagram illustrating an NFC device according to example embodiments.

Elements used to operate an NFC device 10b in the reader mode as well as elements used to operate the NFC device 10b in the card mode are illustrated in FIG. 17.

Referring to FIG. 17, the NFC device 10b may include a resonance circuit 50f and an NFC chip 200b. The resonance circuit 50f may include the antenna 55, a matching circuit 100d and the attenuation circuit 150a.

The matching circuit 50d may further include a sixth capacitor C6 and a seventh capacitor C7 when the matching circuit 50d is compared with the matching circuit with FIG. 4A.

The sixth capacitor C6 may be coupled between the second node N2 and the first power terminal LX1 and the seventh capacitor C7 may be coupled between the second node N2 and the second power terminal LX2.

The NFC chip 200b may be connected to the resonance circuit 50a through the first transmission terminal TX1, the second transmission terminal TX2, the first reception terminal RX1, the second reception terminal RX2, the first power terminal LX1 and the second power terminal LX2.

The NFC chip 200b may perform the signal transmission operation and the signal reception operation through the first power terminal LX1 and the second power terminal LX2 in the card mode, perform the signal transmission operation through the first transmission terminal TX1 and the second transmission terminal TX2 in the reader mode, and perform the signal reception operation through the first reception terminal RX1 and the second reception terminal RX1 in the reader mode.

The NFC chip 200b may include the processor 220, the memory 230, the demodulator 241 (e.g., a first demodulator 241), the modulator 242 (e.g., a first modulator 242), the oscillator 243, the mixer 244, the demultiplexer 245, the transmitter 250, the regulator 260 (e.g., a first regulator 260), a frequency detector (FDET) 500, a rectifier 271, a regulator 273 (e.g., a second regulator 273), a power switch PSW, a second demodulator 281, and/or a second modulator 283.

Descriptions of the processor 220, the memory 230, the first demodulator 241, the first modulator 242, the oscillator 243, the mixer 244, the demultiplexer 245, the transmitter 250, and the regulator 260 are repeated with FIG. 9 and will be omitted.

When the signal reception operation is performed in the card mode, the second demodulator 281 may generate a second reception data RD2 by demodulating the signal supplied from the resonance circuit 50*a* through the first and second power terminals LX1 and LX2 to provide the second reception data RD2 to the processor 220. The processor 220 may decode the second reception data RD2 and may store some or all of the second reception data RD2 in the memory 230.

When the signal transmission operation is performed in the card mode, the processor 220 may read out the output data from the memory 230 and encode the output data to provide a second transmission data TD2 to the second modulator 283, and the second modulator 283 may modulate the second transmission data TD2 to provide a modulation signal to the first and second power terminals LX1 and LX2.

In a measurement mode for detecting a resonance frequency, with respect to a plurality of measurement periods where each measurement period includes a turn-on period and a turn-off period, the transmitter 250 may be enabled to output the first and second transmission signals TS1 and TS2 to the resonance circuit 50*f* during the turn-on period and disabled during the turn-off period, to generate a sensing voltage signal VS to the resonance circuit 50*f*. For example, the sensing voltage signal VS may correspond to a voltage between the first terminal T1 and the second terminal T2.

The frequency detector 500 may be connected to the resonance circuit 50*f* through first and second power terminals LX1 and LX2. The frequency detector 500 may detect a resonance frequency fr of the resonance circuit 50*f* based on the sensing voltage signal VS and may provide the resonance frequency fr to the processor 220. According to example embodiments, the frequency detector 500 may operate based on a control signal CTL3 provided by the processor 220. According to example embodiments, while not depicted in FIG. 17, the NFC chip 200*b* may further include the tag detector 300 and the MISC 400 discussed in connection with FIG. 9, in such cases, the control signal used by the processor 220 to control the frequency detector 500 may be a sixth control signal CTL6. According to example embodiments, the power switch PSW may be implemented using, for example, a transistor.

Figure 18:
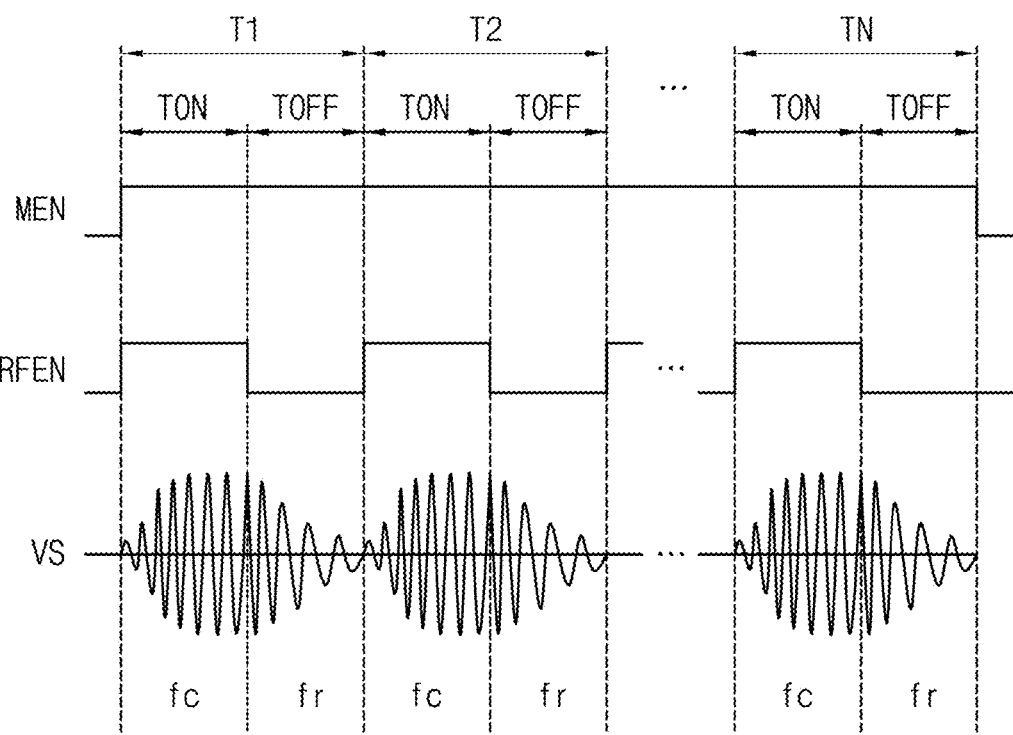
FIG. 18 is a timing diagram illustrating a sensing voltage signal to detect a resonance frequency of the NFC device of FIG. 17 according to example embodiments.

FIG. 18 is a timing diagram illustrating a sensing voltage signal to detect a resonance frequency of the NFC device of FIG. 17 according to example embodiments.

Referring to FIG. 18, a measurement enable signal MEN may be activated during a plurality of measurement periods T1-TN. For example, the measurement enable signal MEN may be activated in a logic high level. The measurement enable signal MEN may be generated and used in the processor 220 in FIG. 17 and may be provided to the frequency detector 500.

Each of the plurality of measurement periods T1-TN may include a turn-on period TON and a turn-off period TOFF. The RF enable signal RFEN may be activated during the turn-on period TON and deactivated during the turn-off period TOFF. The RF enable signal RFEN may be generated by the processor 220 and then provided to the transmitter 250. According to example embodiments, the RF enable signal may be included in the second control signal CTL2.

Based on the RF enable signal RFEN, the transmitter 250 may be enabled to output an RF signal to the resonance circuit 50*f* during the turn-on period TON and disabled (e.g., not enabled to output the RF signal) during the turn-off period TOFF, thereby generating the sensing voltage signal VS at the resonance circuit 50*f*. Even though the RF signal is blocked during the turn-off period TOFF, the sensing voltage signal VS may maintain the oscillation by the induced electromotive force caused in the resonance circuit 50*f* at the end time point of the turn-on period TON.

As a result, the sensing voltage signal VS may oscillate with a transmission frequency fc during the turn-on period TON based on the first and second transmission signal TS1 and TS2 and oscillate with the resonance frequency fr during the turn-off period TOFF based on the induced electromotive force caused in the resonance circuit 50*f* by the first and second transmission signal TS1 and TS2.

As will be described below, the frequency detector 500 may detect, as the resonance frequency fr, the oscillation frequency of the sensing voltage signal VS during the turn-off period TOFF.

Figure 19:
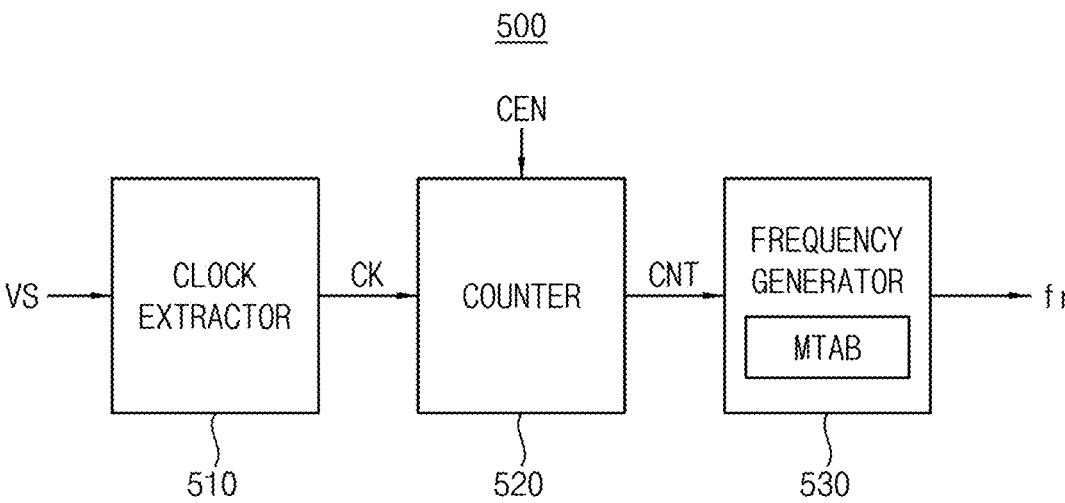
FIG. 19 is a block diagram illustrating an example of the frequency detector in the NFC device of FIG. 17 according to example embodiments.

FIG. 19 is a block diagram illustrating an example of the frequency detector in the NFC device of FIG. 17 according to example embodiments.

Referring to FIG. 19, the frequency detector 500 may include a clock extractor 510, a counter 520 and/or a frequency generator 530.

The clock extractor 510 may generate a clock signal CK toggling according to oscillation of the sensing voltage signal VS. The schemes of generating a clock signal based on an oscillating signal as the sensing voltage signal VS are well known to those skilled in the art and the configuration of the clock extractor 510 may be implemented variously.

The counter 520 may generate a clock count CNT by counting a clock number of the clock signal CK. In example embodiments, the counter 520 may receive a count enable signal CEN and generate the clock count CNT by counting the clock number during an activation time interval of the count enable signal CEN. According to example embodiments, the count enable signal CEN may be included in the third control signal CTL3 provided by the processor 220. The schemes of counting a clock number of a clock signal are well known to those skilled in the art and the configuration of the counter 520 may be implemented variously.

The frequency generator 530 may provide the resonance frequency fr based on the clock count CNT.

In example embodiments, the frequency generator 530 may determine the resonance frequency fr by calculating the resonance frequency fr based on a time interval of the turn-on period TON, a time interval of the turn-off period TOFF, a number of the plurality of measurement periods T1-TN and the measured clock count CNT. In this case, the frequency detector may include simple operation logic for the calculation. The operation logic may be implemented as hardware, software or combination thereof.

In example embodiments, the frequency generator 530 may determine the resonance frequency fr based on a mapping table MTAB indicating mapping relation between a plurality of values of the clock count CNT and a plurality of values of the resonance frequency fr. In this case, the frequency generator 530 may include a memory to store the mapping table MTAB and a circuit to extract the value of the resonance frequency fr corresponding the measured clock count CNT from the memory.

Figure 20:
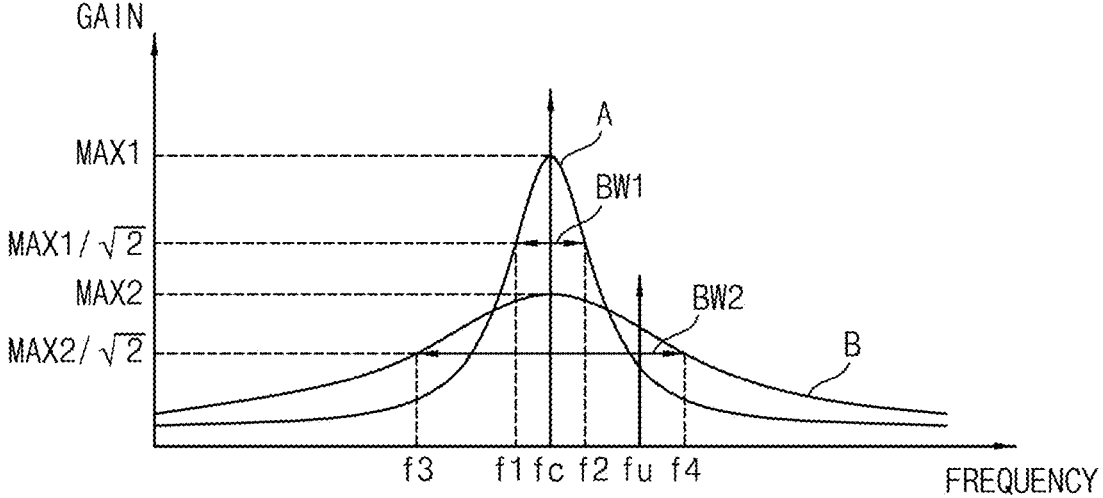
FIG. 20 is a diagram for describing frequency characteristics of a resonator included in an NFC device.

FIG. 20 is a diagram for describing frequency characteristics of a resonator included in an NFC device.

In FIG. 20, a first graph A represents the frequency characteristic of the resonance circuit 50*f*.

Referring to FIGS. 17 and 20, the resonance circuit 50*f* may have the longitudinal frequency characteristic having the center on the carrier frequency fc. The resonance circuit 50*f* may have the maximum (or highest) gain MAX1 at the carrier frequency fc and may have a first bandwidth BW1 where a first frequency f1 and a second frequency f2 serve as cutoff frequencies. The Q factor of the resonance circuit 50f may have a value obtained by dividing the carrier frequency fc by the first bandwidth BW1.

Since the NFC chip 200b maintains the Q factor of the resonance circuit 50f in the reader mode and when the signal transmission operation is performed in the card mode, the resonance circuit 50f may have the frequency characteristic as shown in the first graph A in the reader mode and when the signal transmission operation is performed in the card mode.

If the frequency characteristic of the resonance circuit 50f is not changed when the signal reception operation is performed in the card mode, as shown in FIG. 20, a high-speed signal having the high frequency fu equal to or higher than the second frequency f2 (for instance, the high frequency of 848 Kbps or more) is filtered by the resonance circuit 50f, so the NFC chip 200b may not normally demodulate the input data provided from the external device. Thus, the NFC device 10b may not perform the high-speed communication.

The bandwidth BW1 of the resonance circuit 50f is reduced as the size of the antenna included in the resonance circuit 50f becomes reduced and the intensity of the electromagnetic wave EMW received from the external device becomes weak, so the available communication speed of the NFC device 10b may be further limited.

As will be described below, the NFC chip 200 included in the NFC device 10 may reduce the Q factor of the resonance circuit 50f when the signal reception operation is performed in the card mode. For instance, the NFC chip 200b reduces the gain of the resonance circuit 50f by connecting the terminal connected to the resonance circuit 50f to the ground voltage VSS through the pull-down load when the signal reception operation is performed in the card mode, so the resonance circuit 50f may have the frequency characteristic as shown in a second graph B of FIG. 20. At this time, the resonance circuit 50f may have the maximum (or highest) gain MAX2 at the carrier frequency fc and may have a second bandwidth BW2 where a third frequency f3 and a fourth frequency f4 serve as cutoff frequencies. Since the Q factor of the resonance circuit 50f may have a value obtained by dividing the carrier frequency fc by the second bandwidth BW2, the Q factor of the resonance circuit 50f is reduced.

In this case, even when the NFC device 10b receives the high-speed signal having the high frequency fu equal to or higher than the second frequency f2 (for instance, the high frequency of 848 Kbps or more), the high-speed signal may be normally received without being filtered. Thus, the available communication speed of the NFC device 10b may be increased.

Meanwhile, since the load modulation characteristic is lowered as the gain of the resonance circuit 50f is reduced in the signal transmit operation, as described above, the NFC chip 200b cuts off the terminal connected to the resonance circuit 50f from the ground voltage VSS when the signal transmission operation is performed, so that the Q factor of the resonance circuit 50f may be maintained.

Therefore, in the matching circuit of an NFC device, a resonance circuit of an NFC device and the NFC device according to example embodiments, the matching circuit includes first passive elements coupled in series between a first terminal of an antenna and a first transmission terminal of an NFC chip, and a second passive element directly coupled between a second terminal of the antenna and a second transmission terminal of the NFC chip and the second passive element includes a capacitor instead of an inductor. Accordingly, power of transmission signals may be increased, which are provided to the first and second transmission terminals when a signal transmission operation is performed in a reader mode of the NFC device.

Figure 21A:
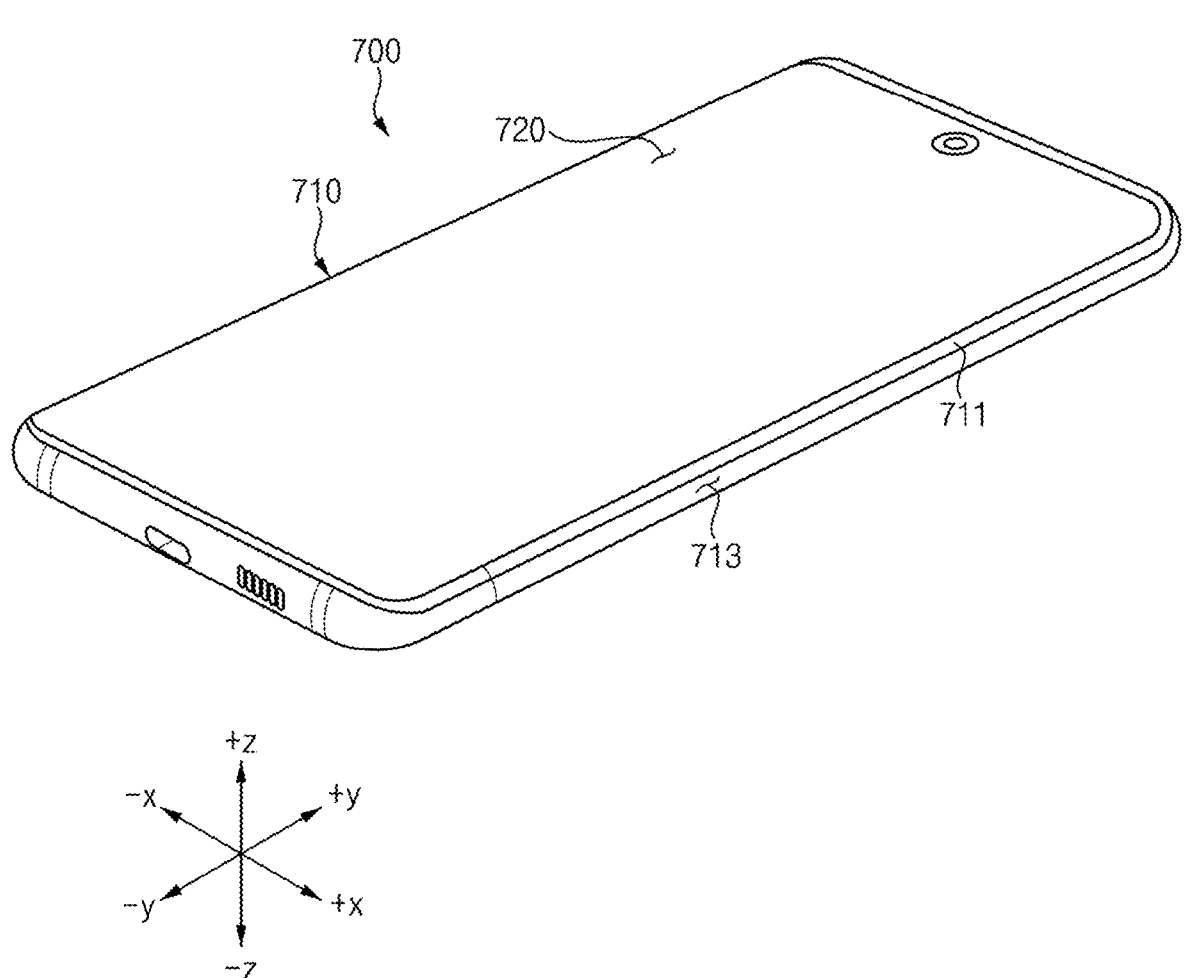
FIG. 21A is a perspective view of a front surface of an electronic device according to example embodiments.
Figure 21B:
FIG. 21B is a perspective view of a rear surface according to example embodiments.

FIG. 21A is a perspective view of a front surface of an electronic device 700 (e.g., a surface located in +z direction of the electronic device 700 of FIG. 21A) according to example embodiments. FIG. 21B is a perspective view of a rear surface of the electronic device 700 (e.g., a surface located in −z direction of the electronic device 700 of FIG. 21B) according to example embodiments.

Referring to FIGS. 21A and 21B, the electronic device 700 may include a housing 710 and the housing 710 may include a front plate 711, a rear plate 712, and a side member 713 surrounding a space between the front plate 711 and the rear plate 712. The front plate 711 and the rear plate 712 may extend in +x direction and −x direction and may extend in +y direction and −y direction.

In example embodiments, a display 720 may be disposed on the front plate 711 of the housing 710. In example embodiments, the display 720 may occupy most of the front surface of the electronic device 700 (e.g., a surface located in the +z direction of the electronic device 700 of FIG. 21A).

In example embodiments, the rear plate 712 may be formed of coated or colored glass, ceramic, polymer, metal (e.g., aluminum, stainless steel, or magnesium), or a combination of at least two of the above materials. According to example embodiments, the rear plate 712 may include a curved part that is bent from at least one end toward the side member 713 and extends seamlessly.

In example embodiments, a camera module 722 may be disposed on the rear plate 712.

In example embodiments, the side member 713 may be coupled to the rear plate 712, and may include a metal and/or a polymer. In example embodiments, the rear plate 712 and the side member 713 may be integrally formed and include the same material (e.g., a metal material such as aluminum), or similar materials.

In example embodiments, a conductive portion of the side member 713 may be electrically connected to the wireless communication circuit to operate as an antenna radiator that transmits and/or receives radio frequency (RF) signals of a specified frequency band. In example embodiments, the wireless communication circuit may transmit an RF signal of a frequency band designated in the conductive portion of the side member 713 or receive an RF signal of a designated frequency band from the conductive portion.

The electronic device 700 shown in FIGS. 21A and 21B may correspond to an example, and the present disclosure may be applicable to various user devices including a part capable of operating as an antenna radiator. For example, the present disclosure may be applied to a foldable electronic device that may be folded horizontally or vertically by adopting a flexible display and hinge structure, a tablet, or a laptop.

Figure 22:
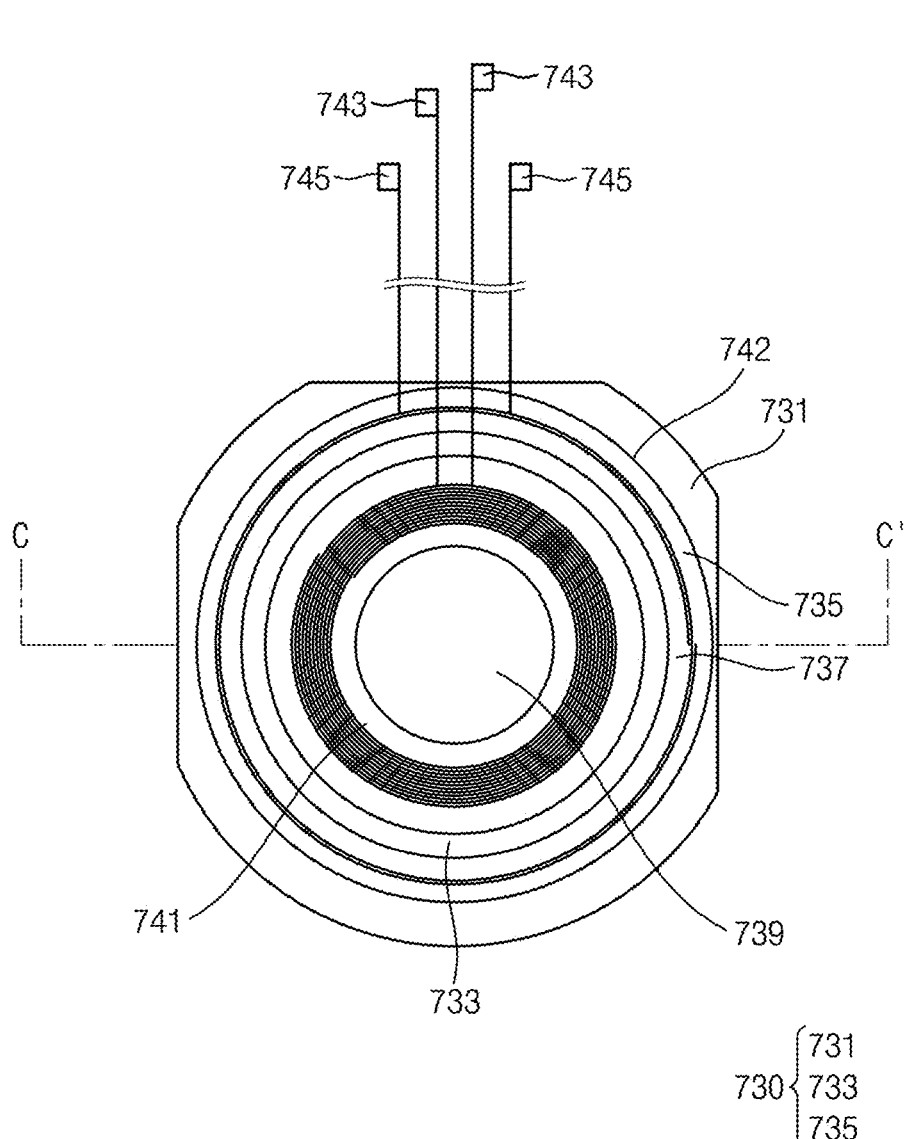
FIG. 22 is a plan view of a coil module in the electronic device of FIGS. 21A and 21B.

FIG. 22 is a plan view of a coil module in the electronic device of FIGS. 21A and 21B.

Figure 23:
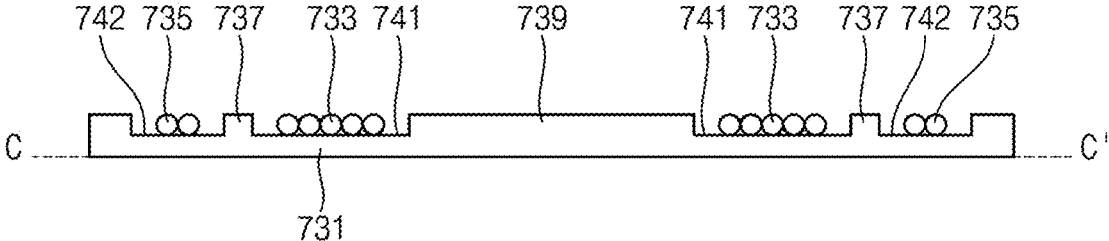
FIG. 23 is a cross-sectional view of the coil module in FIG. 22 taken along C-C'.

FIG. 23 is a cross-sectional view of the coil module in FIG. 22 taken along C-C'.

Referring to FIGS. 22 and 23, the electronic device 700 may include a shielding member 731 attached to an inner surface of an external part such as the housing 710, and a pair of coils 733 and 735 attached to the shielding member 731. The coils 733 and 735 are mounted on a same plane (or similar planes). The shielding member 731 and the coils 733 and 735 are collectively referred to herein as a coil module 730.

The coil module 730 is attached to the inner surface of the rear plate 712 and is connected to the circuits of the electronic device 700, (e.g. a communication circuit or a charging circuit) via a plurality of terminals 749 (discussed further below in connection with FIG. 25). As illustrated in FIGS. 22 and 23, the coil module 730 includes the shielding member 731 and the coils 733 and 735.

The shielding member 731 may be formed by injection molding, having first and second accommodation grooves 741 and 742 respectively on a surface thereof. The first and second accommodation grooves 741 and 742 respectively are circular in shape and recessed into one surface of the shielding member 731. The second accommodation groove 742 surrounds the first accommodation groove 741, being concentric with the first accommodation groove 741. A shielding wall 737 is interposed between the first and second accommodation grooves 741 and 742.

As stated above, the shielding member 731 contains the iron component which prevents (or reduces) mutual interference between the coils 733 and 735, and prevents the coils 733 and 735 from impacting circuits within the electronic device 700 (or reduces the occurrence or magnitude thereof), caused by electronic waves generated from high-frequency waves, low-frequency waves, or power applied to the coils 733 and 735.

The first coil 733 is accommodated in the first accommodation groove 741 and the second coil 735 is accommodated in the second accommodation groove 742. The first coil 733 and the second coil 735 are formed by spirally winding enamel-insulated conductor wires.

The first coil 733 and the second coil 735 are accommodated in the first and second accommodation grooves 741 and 742, respectively, and the second coil 735 surrounds the first coil 733. Herein, the shielding wall 737 between the first coil 733 and the second coil 735 provides a shielding effect between the coils. In other words, the shielding wall 737 shields interference of electronic waves between the first and second coils 733 and 735 respectively. The first coil 733 and the second coil 735 have connection ends 743 and 745, respectively, extended from one side of the shielding member 731. The connection ends 743 and 745 are connected to circuits of the electronic device 700 via the plurality of terminals provided on the rear plate 712.

When installed, the first coil 733 and the second coil 735 are exposed from one surface of the shielding member 731. However, the first coil 733 and the second coil 735 face the inner surface of the rear plate 712 when the shielding member 731 is attached to the rear plate 712, thereby covering the first and second coils 733 and 735. Consequently, the first coil 733 and the second coil 735 are covered by the shielding member 731 and the rear plate 712.

One of the first and second coils 733 and 735 may be used as a secondary coil for wireless charging and the other coil may be used as an NFC antenna element. The coils 733 and 735 may also be used as antennas for short-range wireless communication, (e.g. BluetoothT™ or terrestrial multimedia broadcasting antennas). Example embodiments of the inventive concepts utilize the first coil 733 as a secondary coil for wireless charging and utilize the second coil 735 as an NFC antenna element.

For wireless charging, the electronic device 700 may be cradled on a charging cradle (not shown) to align a primary coil of a charger with the secondary coil of the electronic device 700 corresponding to the first coil 733. Alternatively, the primary coil is movably mounted in the charging cradle such that when the electronic device 700 is positioned on the charging cradle, the primary coil is moved to align with the electronic device 700.

To align the primary coil of the charging cradle with the first coil 733 of the electronic device 700, the shielding member 731 may have a protrusion portion 739. The protrusion portion 739 protrudes from the first accommodation groove 741 of the shielding member 731. Because the shielding member 731 contains the iron component, the protrusion portion 739 also contains an iron component. That is, because the protrusion portion 739 contains a paramagnetic material, (e.g. the iron component), when the protrusion portion 739 is positioned within the magnetic field of a permanent magnet, an attraction force of the permanent magnet pulls on the protrusion portion 739.

The permanent magnet is attached to the primary coil of the charging cradle. When the electronic device 700 (e.g., a portable terminal 700) is mounted on the charging cradle, the attraction force between the permanent magnet and the shielding member 731, (particularly the protrusion portion 739), aligns the primary coil of the charging cradle with the first coil 733 of the electronic device 700. Furthermore, while the protrusion portion 739 contains the iron component and thus has a paramagnetic property, the protrusion portion 739 may have an additional magnetic portion attached on the first accommodation groove 741 to increase the attraction force between the permanent magnet of the primary coil and the shielding member 731. The additional magnetic portion may be formed of a paramagnetic material.

Figure 24:
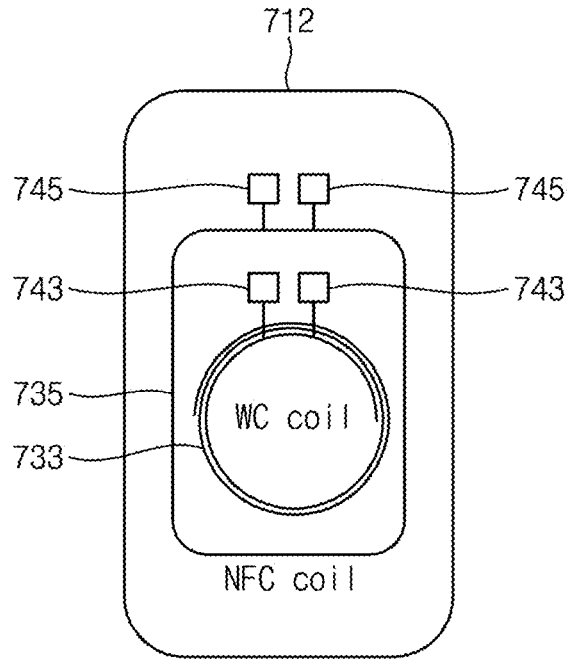
FIG. 24 illustrates mounting of the coil module in FIG. 22 to a rear plate of the electronic device according to example embodiments.

FIG. 24 illustrates mounting of the coil module in FIG. 22 to a rear plate of the electronic device according to example embodiments.

Figure 25:
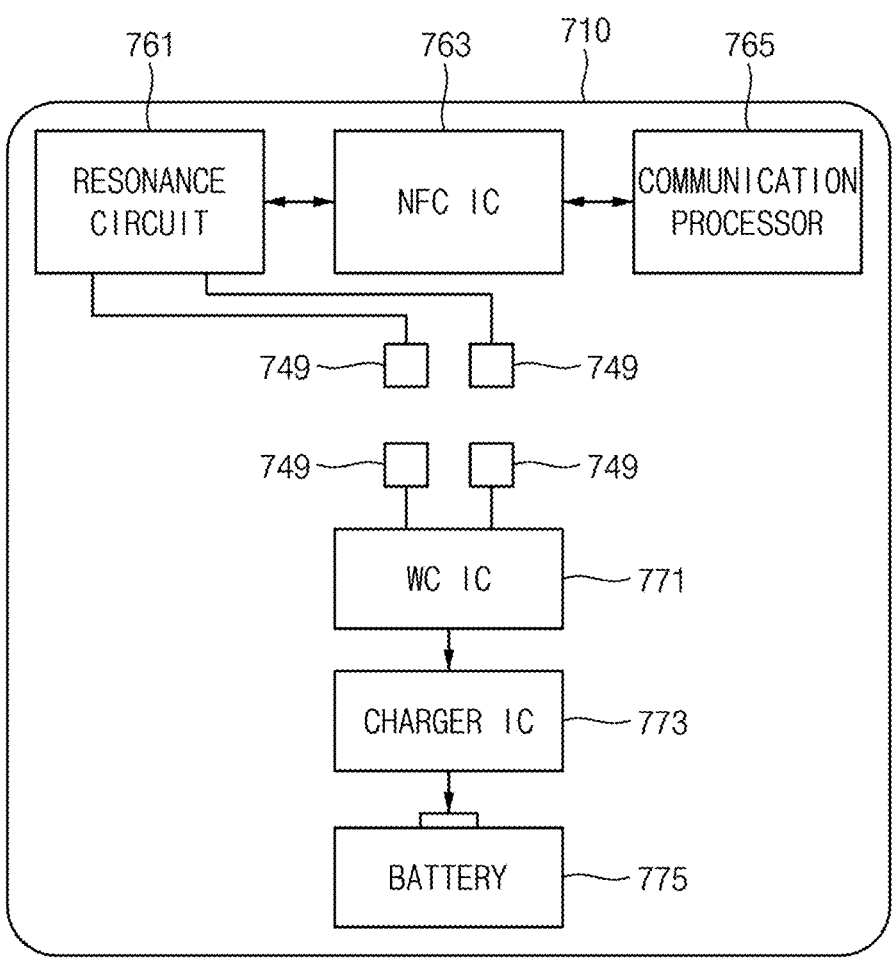
FIG. 25 is a schematic view of the electronic device, with which the rear plate illustrated in FIG. 24 is combinable.

FIG. 25 is a schematic view of the electronic device, with which the rear plate illustrated in FIG. 24 is combinable.

FIGS. 24 and 25 illustrate configurations of an electronic device that implements both a wireless charging function and an NFC function using the coil module 730, with the first coil 733 as a secondary coil used for wireless charging and the second coil 735 as an antenna element for NFC, by way of example.

FIG. 24 illustrates mounting of the coil module 730 on the rear plate 712 of the electronic device and FIG. 25 illustrates the housing 710 to be combined with the rear plate 712 illustrated in FIG. 24.

To implement the wireless charging function and the NFC function using the first and second coils 733 and 735 respectively, the coils 733 and 735 are connected to a communication processor 765 and a charger integrated circuit (IC) 773, respectively. A resonance circuit 761, and an NFC IC 763 or a wireless charger (WC) IC 771, are disposed on a connection of the first coil 733 or the second coil 735 to a circuit of the electronic device 700. These ICs control current and voltage during charging. The NFC IC 763 may employ the NFC chip 200a of FIG. 9 or the NFC chip 200b of FIG. 17.

According to example embodiments in FIGS. 24 and 25, the NFC IC 763 is connected to the communication processor 765 of the electronic device 700 and to the second coil 735 mounted to the rear plate 712 via the plurality of terminals 749. The charger IC 773 is installed inside the electronic device 700 and connected to the battery pack. In addition, the WC IC 771 is connected to the charger IC 773 inside the electronic device 700 and to the first coil 733 mounted to the rear plate 712 through the remaining plurality of terminals 749. According to example embodiments, the resonance circuit 761 may be implemented by one of resonance circuits 50a through 50f.

US 12,573,998 B2

25                                                          26

Figure 26:
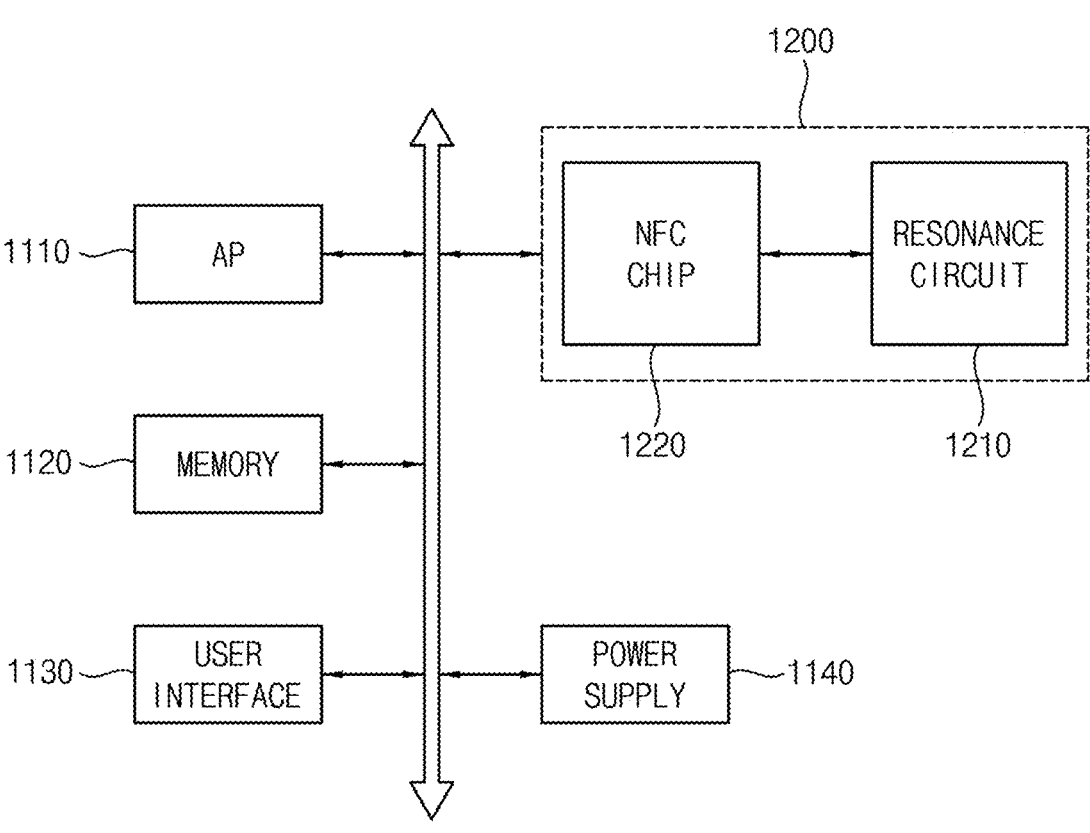
FIG. 26 is a block diagram illustrating an electronic device according to example embodiments.

FIG. 26 is a block diagram illustrating an electronic device according to example embodiments.

Referring to FIG. 26, an electronic device 1000 includes an application processor 1110, an NFC device 1200, a memory device 1120, a user interface 1130 and/or a power supply 1140.

The application processor 1110 may control overall operations of the electronic device 1000. The memory device 1120 may store data used for an operation of the electronic device 1000. For example, the memory device 1120 may store a boot image for booting the electronic device 1000, output data to be outputted to an external device and input data received from the external device.

The NFC device 1200 may provide the output data stored in the memory device 1120 to the external device through NFC and store the input data received from the external device through NFC into the memory device 1120. The NFC device 1200 may include a resonance circuit 1210 and an NFC chip 1220. The resonance circuit 1210 may employ one of the resonance circuits mentioned above and the NFC chip 1220 may employ the NFC chip 200a of FIG. 9 or the NFC chip 200b of FIG. 17.

The user interface 1130 may include at least one input device, such as a keypad or a touch screen, and at least one output device, such as a speaker or a display device. The power supply 1140 may supply a power supply voltage to the electronic device 1000.

In example embodiments, the electronic device 1000 and/or components of the electronic device 1000 may be packaged in various forms.

Example embodiments may be employed in an electronic device including an NFC device. For example, the present disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an Internet of things (IoT) device, an Internet of everything (IoE) device, an e-book reader, a virtual reality (VR) device, an augmented reality (AR) device, a robotic device, a drone, an automotive device, etc.

Conventional devices and methods for performing NFC communication rely on NFC chips coupled to matching circuits having passive elements in a symmetric configuration. For example, the passive elements may include an inductor. As a result of thus configuration, the NFC chips are unable to sufficiently increase the power of transmission signals for use in a reader mode transmission operation of the conventional devices and methods.

However, according to example embodiments, improved devices are provided for performing NFC communication. For example, the improved devices may include a matching circuit having passive elements in an asymmetric configuration. In some examples, the passive elements may include a capacitor directly coupled between a terminal of an antenna and a transmission terminal of an NFC chip (without an inductor being directly coupled between the terminal and the transmission terminal). Through this configuration, the NFC chip is able to sufficiently increase the power of transmission signals for use in a reader mode transmission operation of the improved devices and methods. Accordingly, the improved devices and methods overcome the deficiencies of the conventional devices and methods to at least increase transmission signal power in a reader mode transmission operation of an NFC device.

According to example embodiments, operations described herein as being performed by the NFC system 5, the NFC device 10, the NFC device 600, the NFC chip 200, the NFC chip 650, the reader circuit 201, the card circuit 203, the NFC device 10a, the NFC chip 200a, the processor 220, the demodulator 241, the modulator 242, the oscillator 243, the mixer 244, the demultiplexer 245, the transmitter 250, the regulator 260, the tag detector 300, the MISC 400, the controller 251, the current monitor 310, the I/V converter 320, the ADC 330, the decision circuit 340, the MIMF 405, the current detector 410, the NFC device 10b, the NFC chip 200b, the FDET 500, the rectifier 271, the regulator 273, the power switch PSW, the second demodulator 281, the second modulator 283, the clock extractor 510, the counter 520, the frequency generator 530, the electronic device 700, the communication processor 765, the charger IC 773, the NFC IC 763, the WC IC 771, the electronic device 1000, the application processor 1110, the NFC device 1200 and/or the NFC chip 1220 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium (e.g., the memory 230, the storage device 460, the memory device 1120, etc.). A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

It will be understood that when an element is referred to as being "connected" or "coupled" to another element, it may be directly connected or coupled to the other element or intervening elements may be present. As used herein the term "and/or" includes any and all combinations of one or more of the associated listed items.

Although terms of "first" or "second" may be used to explain various components, the components are not limited to the terms. These terms should be used only to distinguish one component from another component. For example, a "first" component may be referred to as a "second" component, or similarly, and the "second" component may be referred to as the "first" component. Expressions such as "at least one of" when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

The foregoing is illustrative of example embodiments and is not to be construed as limiting thereof. Although example embodiments have been described, those skilled in the art will readily appreciate that many modifications are possible therein without materially departing from the novel teachings and advantages of the present disclosure. Accordingly, all such modifications are intended to be included within the scope of the present disclosure as defined in the claims.

What is claimed is:

1. A matching circuit of a near field communication (NFC) device, the matching circuit being coupled between an antenna and an NFC chip, and the matching circuit comprising:
first passive elements coupled in series between a first terminal of the antenna and a first transmission terminal of the NFC chip, the antenna configured to respond to an electromagnetic wave;
a second passive element having a first end and a second end, the first end being directly coupled to a second terminal of the antenna, and the second end being directly coupled to a second transmission terminal of the NFC chip, the first passive elements and the second passive element being asymmetric with respect to each other; and
third passive elements coupled to at least the first terminal and the second transmission terminal.

2. The matching circuit of claim 1, wherein the first passive elements include:
a first capacitor coupled between the first terminal and a first node, and
an inductor coupled between the first node and the first transmission terminal; and
the second passive element includes a second capacitor directly coupled between the second terminal and the second transmission terminal.

3. The matching circuit of claim 2, wherein the third passive elements include:
a third capacitor coupled between the first terminal and a ground voltage,
a fourth capacitor coupled between the first node and a second node, the second transmission terminal and the second capacitor being coupled to the second node, and
a fifth capacitor coupled between the second node and the ground voltage, and
the matching circuit is configured to adjust a mismatch of a transmission impedance by adjusting capacitances of the fourth capacitor and the fifth capacitor.

4. The matching circuit of claim 2, wherein the third passive elements include:
a third capacitor coupled between the first terminal and a ground voltage;
a fourth capacitor coupled between the first node and a second node, the second transmission terminal and the second capacitor being coupled to the second node;

a fifth capacitor coupled between the second node and the ground voltage; and
a sixth capacitor coupled between the second terminal and the ground voltage.

5. The matching circuit of claim 2, wherein the third passive elements include:
a third capacitor coupled between the first terminal and a ground voltage;
a fourth capacitor coupled between the first node and the ground voltage; and
a fifth capacitor coupled between the ground voltage and a second node, the second transmission terminal and the second capacitor being coupled to the second node.

6. The matching circuit of claim 3, wherein the matching circuit is configured to adjust a resonance frequency by adjusting a capacitance of the third capacitor.

7. A resonance circuit of a near field communication (NFC) device, the resonance circuit comprising:
an antenna configured to respond to an electromagnetic wave; and
a matching circuit coupled between the antenna and an NFC chip, the matching circuit configured to perform an impedance matching and adjust a resonance frequency, and the matching circuit including,
first passive elements connected in series between a first terminal of the antenna and a first transmission terminal of the NFC chip,
a second passive element having a first end and a second end, the first end being directly coupled to a second terminal of the antenna, and the second end being directly coupled to a second transmission terminal of the NFC chip, the first passive elements and the second passive element being asymmetric with respect to each other, and
third passive elements coupled to at least the first terminal and the second transmission terminal.

8. The resonance circuit of claim 7, wherein
the first passive elements include:
a first capacitor coupled between the first terminal and a first node, and
an inductor coupled between the first node and the first transmission terminal; and
the second passive element includes a second capacitor directly coupled between the second terminal and the second transmission terminal.

9. The resonance circuit of claim 8, wherein the third passive elements include:
a third capacitor coupled between the first terminal and a ground voltage;
a fourth capacitor coupled between the first node and a second node, the second transmission terminal and the second capacitor being coupled to the second node; and
a fifth capacitor coupled between the second node and the ground voltage.

10. The resonance circuit of claim 9, wherein the matching circuit is configured to:
adjust a mismatch of a transmission impedance by adjusting capacitances of the fourth capacitor and the fifth capacitor; and
adjust the resonance frequency by adjusting a capacitance of the third capacitor.

11. The resonance circuit of claim 8, wherein the third passive elements include:
a third capacitor coupled between the first terminal and a ground voltage;
a fourth capacitor coupled between the first node and the ground voltage; and a fifth capacitor coupled between the ground voltage and a second node, the second transmission terminal and the second capacitor being coupled to the second node.

12. The resonance circuit of claim 7, wherein a current flows through the antenna in response to a voltage between the first transmission terminal and the second transmission terminal being greater than a current that would flow through the antenna were the matching circuit to include comparative passive elements in a symmetric configuration.

13. The resonance circuit of claim 7, further comprising: an attenuation circuit connected to the first terminal, the second terminal, a first reception terminal of the NFC chip and a second reception terminal of the NFC chip, the attenuation circuit configured to attenuate a signal induced in the antenna in response to the electromagnetic wave.

14. The resonance circuit of claim 13, wherein the attenuation circuit includes:
a first attenuation capacitor coupled between the first terminal and the first reception terminal; and
a second attenuation capacitor coupled between the second terminal and the second reception terminal.

15. The resonance circuit of claim 14, wherein the first attenuation capacitor and the second attenuation capacitor have a same capacitance.

16. The resonance circuit of claim 13, wherein the attenuation circuit includes:
a first attenuation resistor and a first attenuation capacitor coupled in series between the first terminal and the first reception terminal; and
a second attenuation resistor and a second attenuation capacitor coupled in series between the second terminal and the second reception terminal.

17. A near field communication (NFC) device, comprising:
an antenna;
a matching circuit, coupled between first and second terminals of the antenna, the matching circuit being configured to generate a field voltage in response to an electromagnetic field induced in the antenna; and
an NFC chip configured to,
detect an NFC card or an NFC reader based on a magnitude of the field voltage,
operate in a reader mode in response to detecting the NFC card, and
operate in a card mode in response to detecting the NFC reader, wherein the matching circuit includes,
first passive elements connected in series between a first terminal of the antenna and a first transmission terminal of the NFC chip, the first passive elements including,
a first capacitor coupled between the first terminal and a first node, and
an inductor coupled between the first node and the first transmission terminal,
a second passive element directly coupled to a second terminal of the antenna and a second transmission terminal of the NFC chip, the second passive element including a second capacitor directly coupled between the second terminal and the second transmission terminal, and
third passive elements coupled to at least the first terminal and the second transmission terminal.

18. The NFC device of claim 17, wherein:
the NFC chip is coupled to the matching circuit through a first reception terminal, a second reception terminal, the first transmission terminal, the second transmission terminal, a first power terminal and a second power terminal; and
the NFC chip is configured to,
perform a first transmission operation and a first reception operation through the first power terminal and the second power terminal in the card mode,
perform a second transmission operation through the first transmission terminal and the second transmission terminal in the reader mode, and
perform a second reception operation through the first reception terminal and the second reception terminal in the reader mode.

19. The NFC device of claim 17, wherein the NFC chip comprises:
a transmitter connected to the matching circuit through the first transmission terminal and the second transmission terminal, the transmitter including,
a first driver including,
a plurality of first pull-up transistors connected in parallel between a transmission power supply voltage and the first transmission terminal, and
a plurality of first pull-down transistors connected in parallel between the first transmission terminal and a ground voltage, a second driver including,
a plurality of second pull-up transistors connected in parallel between the transmission power supply voltage and the second transmission terminal, and
a plurality of second pull-down transistors connected in parallel between the second transmission terminal and the ground voltage, and
a controller configured to provide first driving signals to the first driver and second driving signals to the second driver in response to a control signal, the controller being configured to activate the first driving signals and the second driving signals asymmetrically when the NFC chip performs a transmission operation in the reader mode, the transmission operation in the reader mode being performed through the first transmission terminal and the second transmission terminal.

20. The NFC device of claim 17, wherein
the third passive elements include,
a third capacitor coupled between the first terminal and a ground voltage,
a fourth capacitor coupled between the first node and a second node, the second transmission terminal and the second capacitor being coupled to the second node, and
a fifth capacitor coupled between the second node and the ground voltage; and
the matching circuit is configured to,
adjust a mismatch of a transmission impedance by adjusting capacitances of the fourth capacitor and the fifth capacitor, and
adjust a resonance frequency by adjusting a capacitance of the third capacitor.

* * * * *